US008255090B2

(12) United States Patent
Frader-Thompson et al.

(10) Patent No.: US 8,255,090 B2
(45) Date of Patent: Aug. 28, 2012

(54) SYSTEM AND METHOD FOR HOME ENERGY MONITOR AND CONTROL

(75) Inventors: Seth Frader-Thompson, Brooklyn, NY (US); Stephan Von Muehlen, New York, NY (US); Thomas Kennedy, New York, NY (US)

(73) Assignee: Energyhub, Brooklyn, NY (US)

( * ) Notice: Subject to any disclaimer, the term of this patent is extended or adjusted under 35 U.S.C. 154(b) by 714 days.

(21) Appl. No.: 12/024,957

(22) Filed: Feb. 1, 2008

(65) Prior Publication Data
US 2009/0195349 A1    Aug. 6, 2009

(51) Int. Cl.
G05D 3/12 (2006.01)
G05D 5/00 (2006.01)
G05D 9/00 (2006.01)
G05D 11/00 (2006.01)
G05D 17/00 (2006.01)
G06Q 20/00 (2012.01)
G01R 11/56 (2006.01)
G01R 21/06 (2006.01)
G01R 21/133 (2006.01)
G06F 17/00 (2006.01)
G06F 11/00 (2006.01)
G06F 15/173 (2006.01)

(52) U.S. Cl. ............ 700/295; 702/62; 702/188; 705/63; 705/412; 709/224

(58) Field of Classification Search .................. 700/286, 700/291, 295, 297, 11; 702/60–62, 188; 705/63, 412, 34; 709/203, 223, 224, 229, 709/249, 238; 713/300, 320, 340; 340/310.11, 340/870.02, 12.22, 12.31, 12.32, 438
See application file for complete search history.

(56) References Cited

U.S. PATENT DOCUMENTS

| 4,080,568 | A | | 3/1978 | Funk |
| 5,101,191 | A | * | 3/1992 | MacFadyen et al. ......... 375/259 |
| 5,859,847 | A | * | 1/1999 | Dew et al. ..................... 370/389 |
| 6,095,867 | A | * | 8/2000 | Brandt et al. ............ 439/620.09 |
| 6,151,640 | A | * | 11/2000 | Buda et al. ...................... 710/11 |
| 6,492,897 | B1 | * | 12/2002 | Mowery, Jr. .................. 455/522 |
| 6,652,330 | B1 | * | 11/2003 | Wasilewski ...................... 440/1 |
| 6,759,946 | B2 | * | 7/2004 | Sahinoglu et al. ......... 340/12.32 |

(Continued)

OTHER PUBLICATIONS

Monitoring Device Manages Energy, Transmission & Distribution World, Aug. 30, 2006, http://tdworld.com/test_monitor_control/highlights/Rockwell-Powermonitor-1000/, pp. 1-3.

(Continued)

*Primary Examiner* — Crystal J Barnes-Bullock
(74) *Attorney, Agent, or Firm* — Turocy & Watson, LLP

(57) ABSTRACT

The invention generally concerns systems and methods for monitoring and controlling the power consumption of a power-consuming device. The system and method may connect to a power source and a power-consuming device, connecting the power-consuming device to the power source. The power usage of the power-consuming device may then be measured and monitored. This monitoring data may then be stored and optionally sent to a controlling device on a data network. The location of the power-consuming device may also be determined, recorded, and sent to a controlling device. The system may also control the power usage of the power-consuming device. In some cases, a remote server may connect multiple energy monitoring systems in order to gain additional efficiencies and foster a community-based social network.

14 Claims, 23 Drawing Sheets

U.S. PATENT DOCUMENTS

| | | | | |
|---|---|---|---|---|
| 7,035,898 | B1* | 4/2006 | Baker | 709/203 |
| 7,049,976 | B2* | 5/2006 | Hunt et al. | 340/870.02 |
| 7,106,261 | B2 | 9/2006 | Nagel et al. | |
| 7,231,280 | B2* | 6/2007 | Costa | 700/286 |
| 7,231,281 | B2* | 6/2007 | Costa | 700/286 |
| 7,256,684 | B1* | 8/2007 | Cafiero et al. | 340/310.11 |
| 7,281,146 | B2* | 10/2007 | Nalawadi et al. | 713/320 |
| 7,327,221 | B1* | 2/2008 | Callaghan | 340/12.32 |
| 7,383,451 | B2* | 6/2008 | Matsushima et al. | 713/300 |
| 7,463,986 | B2* | 12/2008 | Hayes | 702/62 |
| 7,469,190 | B2* | 12/2008 | Bickel | 702/60 |
| 7,561,977 | B2* | 7/2009 | Horst et al. | 702/62 |
| 7,598,844 | B2* | 10/2009 | Corcoran et al. | 340/12.32 |
| 7,626,493 | B2* | 12/2009 | Hicks, III | 340/438 |
| 7,676,571 | B2* | 3/2010 | LeMay et al. | 709/224 |
| 7,724,778 | B2* | 5/2010 | Ying | 370/489 |
| 7,729,993 | B2* | 6/2010 | Baraty | 705/63 |
| 7,761,910 | B2* | 7/2010 | Ransom et al. | 726/6 |
| 7,778,940 | B2* | 8/2010 | Mazzarella | 705/412 |
| 7,831,844 | B2* | 11/2010 | Kestelli | 713/300 |
| 7,911,326 | B2* | 3/2011 | Sutardja | 340/12.32 |
| 2002/0178387 | A1* | 11/2002 | Theron | 713/300 |
| 2003/0187520 | A1* | 10/2003 | Pearlman et al. | 700/11 |
| 2003/0193405 | A1* | 10/2003 | Hunt et al. | 340/870.02 |
| 2003/0225483 | A1* | 12/2003 | Santinato et al. | 700/295 |
| 2004/0054789 | A1* | 3/2004 | Breh et al. | 709/229 |
| 2004/0078153 | A1 | 4/2004 | Bartone et al. | |
| 2004/0186670 | A1 | 9/2004 | Hart | |
| 2006/0174102 | A1 | 8/2006 | Smith et al. | |
| 2006/0259201 | A1* | 11/2006 | Brown | 700/291 |
| 2007/0083668 | A1* | 4/2007 | Kelsey et al. | 709/238 |
| 2007/0123108 | A1 | 5/2007 | Ivanova et al. | |
| 2007/0139220 | A1 | 6/2007 | Mirza et al. | |
| 2007/0149013 | A1 | 6/2007 | Eastham et al. | |
| 2007/0198748 | A1* | 8/2007 | Ametsitsi et al. | 709/249 |
| 2007/0245165 | A1 | 10/2007 | Fung | |
| 2007/0271006 | A1 | 11/2007 | Golden et al. | |
| 2007/0283005 | A1* | 12/2007 | Beliles et al. | 709/224 |
| 2008/0081676 | A1* | 4/2008 | Chakraborty et al. | 455/574 |
| 2008/0133956 | A1* | 6/2008 | Fadell | 713/340 |
| 2008/0167756 | A1* | 7/2008 | Golden et al. | 700/297 |
| 2008/0281663 | A1* | 11/2008 | Hakim et al. | 705/8 |
| 2009/0024545 | A1* | 1/2009 | Golden et al. | 705/412 |
| 2009/0083167 | A1* | 3/2009 | Subbloie | 705/34 |
| 2009/0234512 | A1* | 9/2009 | Ewing et al. | 700/295 |
| 2009/0315699 | A1* | 12/2009 | Satish et al. | 340/533 |

OTHER PUBLICATIONS

Michael Graham Richard, EUM-2000-Whole House Energy Monitor, Science & Technology (electronics), http://www.treehugger.com/files/2005/07/eum2000_a_whole.php, Jul. 23, 2005, p. 1 of 3.

Energy literacy: How can design massively reduce the demand for energy in buildings?, http://www.moreassociates.com/research/energy_literacy, Feb. 7, 2008, pp. 1-5.

Ewgeco Electricity Water and Gas Monitor Ewgeco The Utility Monitoring Device, http://ewgeco.com/, pp. 1-2, Feb. 7, 2008.

Information Aesthetics, (free) energy monitoring device, http://infosthetics.com/archives/2007/04/morepower_free_energy_monitor_device.html, Feb. 7, 2008, pp. 1-9.

Ellyssa Kroski, The Hive Mind: Folksonomies and User-Based Tagging, http://infotangle.blogsome.com/2005/12/07/the-hive-mind-folksonomies-and-user-based-tag . . . , pp. 1-17, Feb. 1, 2008.

Steve Lohr, Ditigal Tools Help Users Save Energy, Study Finds, The New York Times, http://www.nytimes.com/2008/01/10/technology/10energy.html?ei=5087&em=&en=daa6b . . . , pp. 1-3, Jan. 11, 2008.

Notification of Transmittal of the International Search Report and the Written Opinion of the International Searching Authority, or the Declaration, including the International Search Report issued Mar. 13, 2009 by the International Searching Authority for PCT/US2009/032389.

International Preliminary Report on Patentability and Written Opinion for International Application No. PCT/US2009/032389, date of mailing Mar. 13, 2009, 9 pages.

* cited by examiner

SYSTEM AND METHOD FOR HOME ENERGY MONITOR AND CONTROL

FIELD OF THE INVENTION

The present invention relates generally to systems and methods for monitoring and controlling the energy consumption and generation of devices in a household. The present invention also relates to user-centric systems and methods that educate and empower users to control their energy consumption habits.

BACKGROUND OF THE INVENTION

Electric power drives modern society. Computers, light bulbs, televisions, appliances, iPods, and all sorts of other everyday devices need electricity in order to operate. The wiring systems of modern households are growing more complicated and more powerful every day. Businesses and factories have even more complex electrical systems. Unfortunately, as the individual need for power consumption increases, environmental and political forces are starting to create a burden on the energy industry.

Issues such as global warming and the pending oil crisis have Americans constantly worried about the effects of their individual effect in relation to national energy concerns. Some people are even trying to push themselves "off-the-grid" by only consuming renewable energy sources, such as solar or wind power. Carbon credits and carbon footprints have entered the common vernacular and can often be heard on major news networks as well as major motion pictures. But even with all of this concern relating to the conservation of resources and energy, it remains nearly impossible for a concerned global citizen to be able to actively measure the effects of their day-to-day energy consumption.

Some electric companies have recently switched to a pricing model where the price of a kilowatt-hour of power is constantly in flux. This constant change in pricing only serves to bring confusion to the consumer base, as a typical consumer has no clue what the going rate of electricity may be, nor do they have any clue what their current consumption is. The only metric of consumption that electricity providers give to consumers is in the form of a bill at the end of the month; not nearly enough information to inform consumers of their daily—not to even mention real-time—energy needs.

It should be readily apparent to those skilled in the art that the above situations and others of their kind do not satisfactorily address the needs and desires of consumers wishing to take part in conservation and other environmental activities. Further, these situations are leaving consumers in the dark about their energy consumption and expenditures, potentially preventing them from making wiser energy-conscious decisions in their homes and businesses.

More broadly, no system currently exists in which a consumer can effectively and efficiently monitor, understand, and control their personal energy usage in a home or business.

Other problems and drawbacks also exist.

SUMMARY OF THE INVENTION

According to one embodiment, the invention comprises a system and method for monitoring and controlling the power consumption of a power-consuming device. The system and method may connect to a power source and a power-consuming device, connecting the power-consuming device to the power source. The power usage of the power-consuming device may then be measured and monitored. This monitoring data may then be stored and optionally sent to a controlling device on a data network. The location of the power-consuming device may also be determined, recorded, and sent to a controlling device. The system may also control the power usage of the power-consuming device.

According to another embodiment, a system and method for controlling and monitoring a power network is described. The system may connect to a power network and a data network. The system may also connect to nodes on the power or data networks. The system may receive monitoring information from the various nodes. The system may contain a controller and a user interface. The controller may receive and analyze monitoring information and, using the user interface, present that analysis to a user.

In yet another embodiment, a community-based system for optimizing and encouraging the conservation of resources is described. A server connected to a network may contain information concerning a set of users and the home energy monitoring systems of those users. The server may collect information about the users' home energy monitoring systems and use that information to update the home energy monitoring systems. The server may also receive information from third party sources and use that information to update the home energy monitoring systems.

The present invention, which in some instances may be referred to as the "home energy network" product, has numerous benefits and advantages. The invention provides a systemized framework for monitoring and controlling the vast amount of power consuming and providing devices in a business or home.

The ability to compare energy savings and conservation with the energy savings and conservation of other users in a community not only encourages the efficient management of resources, but also allows for previously unprecedented experimentation and information dissemination amongst a large group of consumers.

Further, the ability to monitor mobile devices as they move around a household or business allows more precise calculations as to the true power consumption profile of the various devices connected to the monitoring system. Improved power consumption profiles then, in turn, allow users to drastically improve energy consuming behaviors and habits in order gain increased energy efficiency.

Because the invention allows users to more efficiently monitor and manage their consumption of energy in homes, businesses, and other power-consuming structures or entities, overall energy awareness amongst consumers will be drastically improved. This may lead to an overall reduction of strains on precious resources in the global landscape Other benefits and advantages of the invention will be apparent to the person of ordinary skill in the art.

The accompanying drawings are included to provide a further understanding of the invention and are incorporated in and constitute part of this specification, illustrate several embodiments of the invention and, together with the description, serve to explain the principles of the invention. It will become apparent from the drawings and detailed description that other objects, advantages and benefits of the invention also exist.

Additional features and advantages of the invention will be set forth in the description that follows, including the figures, and in part will be apparent from the description, or may be learned by practice of the invention. The objectives and other advantages of the invention will be realized and attained by the system and methods, particularly pointed out in the written description and claims hereof as well as the appended drawings.

BRIEF DESCRIPTION OF THE DRAWINGS

The purpose and advantages of the present invention will be apparent to those of skill in the art from the following detailed description in conjunction with the appended drawings in which like reference characters are used to indicate like elements, and in which.

DETAILED DESCRIPTION OF THE INVENTION

Embodiments of the present invention may be directed to an energy network for monitoring, controlling, and understanding the energy profile of a home, business, or other structure or power network. Other embodiments may be directed to an online service allowing users to share experiences and information, as well as compare or compete, in a community-based environment.

Energy Network

Figure 1:
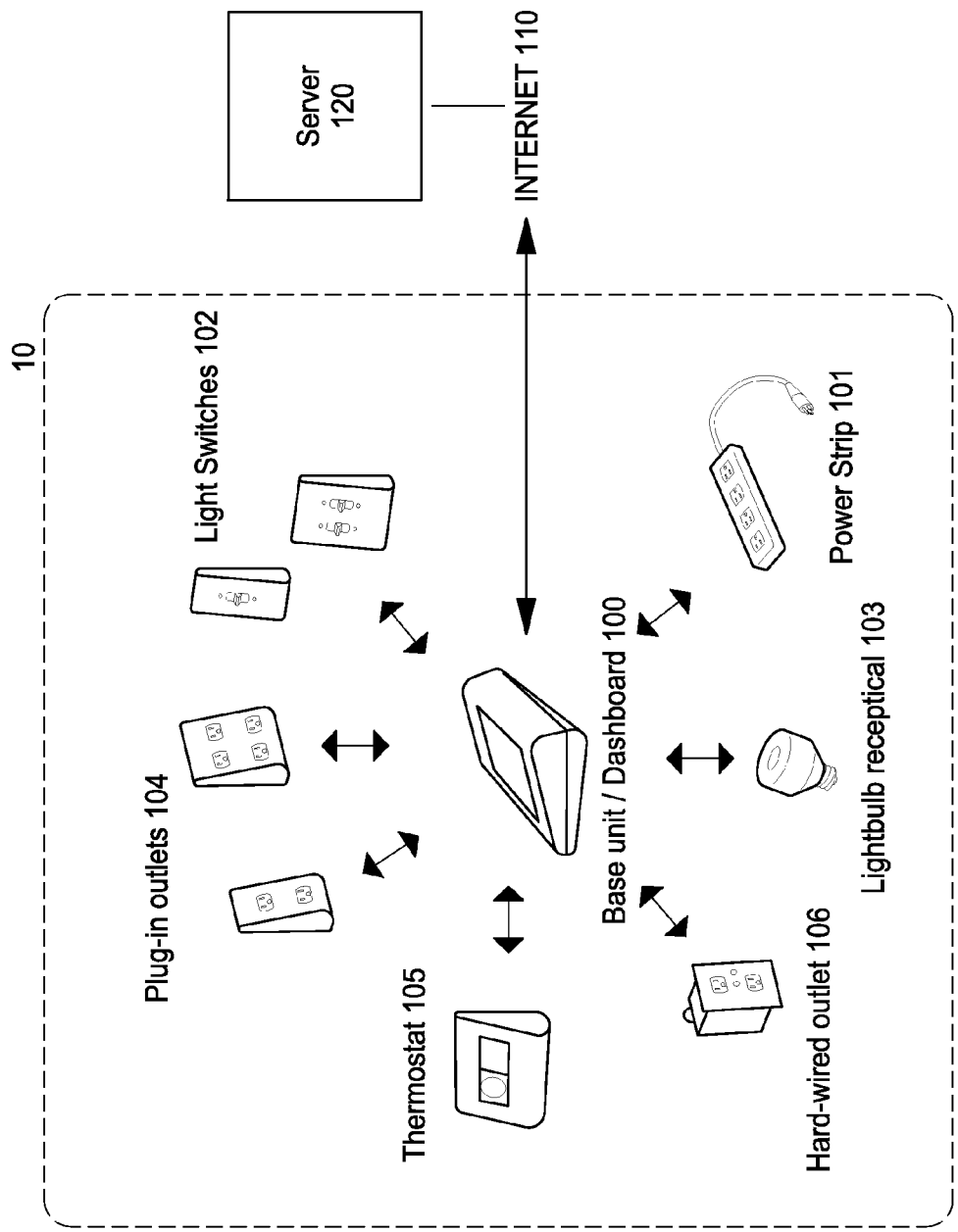
FIG. 1 shows a relational chart according to embodiments of the invention.

FIG. 1 shows a relational chart according to embodiments of the invention. According to some of the various embodiments, a home energy network 10 may be composed of a controller 100 and a distributed network of power monitoring and control nodes 101-106. The nodes may communicate with the controller, any optional repeaters, and each other via a network. In various embodiments, the controller 100 may be composed of a single base station with a display, or may be separated into: a base station to manage data storage and communication, and an interface console with display, buttons, LCD touchscreen, or other control elements. In other aspects, the controller may be separated into a separate node control device and a display device. In still other aspects, the user interface elements may be separate from both the node control device and the display device, such as on a computer, a handheld device (e.g., a cell phone, tablet computer, etc), or in any other type of device. Control, display, and interface functions may also be distributed amongst devices in the home energy network or even outside of the energy network on a public or private network such as the Internet. In other aspects of the invention, the controller may be capable of communicating with a server 120 on the Internet 110. According to various aspects of the invention, Internet 110 may also be a public or private network other than the Internet. The controller 100 may send either raw data gathered from the nodes or processed/aggregated data to the remote server 120.

Figure 2:
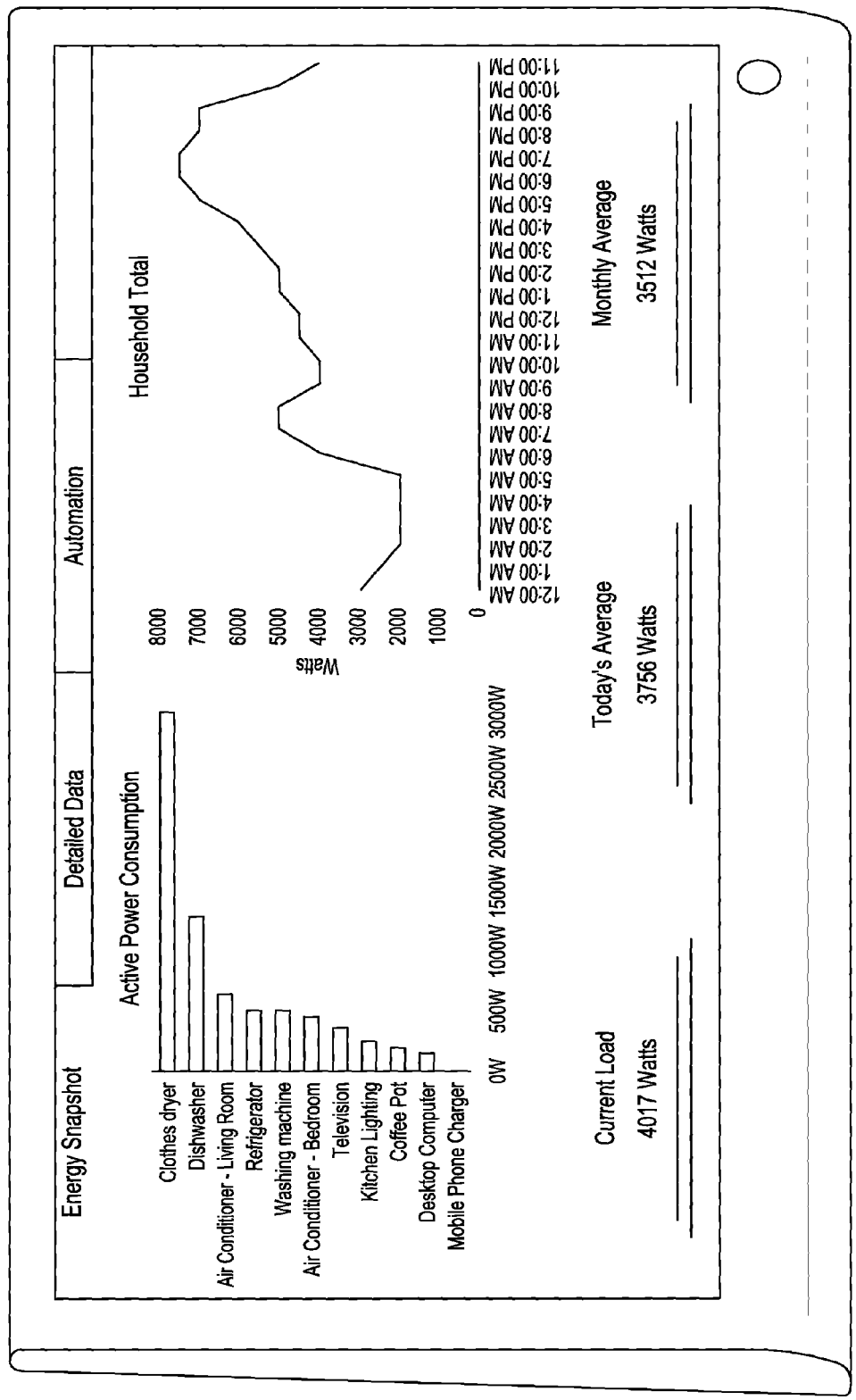
FIG. 2 shows a display unit to be used in the system according to embodiments of the invention.

According to some aspects of the invention, a display unit, as seen in FIG. 2, may function as the "dashboard" for viewing data visualizations and interacting with the system. In various embodiments, this display unit could be a stand-alone controller, a display and input device, or just a display device. The display unit may be wall mounted, handheld, or free-standing. The display unit may contain components such as temperature sensors (thermocouple or thermistors), occupancy sensors, wireless signal detectors, RFID sensors, barcode or magnetic card sensors, biometric sensors, or any other sensor known to one of ordinary skill in the art. The display may be duplicated on a personal computer, through a website on the Internet, on a node or appliance connected to the network or Internet, on a mobile device connected to the network, or to any other device connected to the Internet. The display unit may also be capable of wireless or wired transmission, utilizing any of the transmission protocols described herein or known to those of skill in the art.

Figure 3:
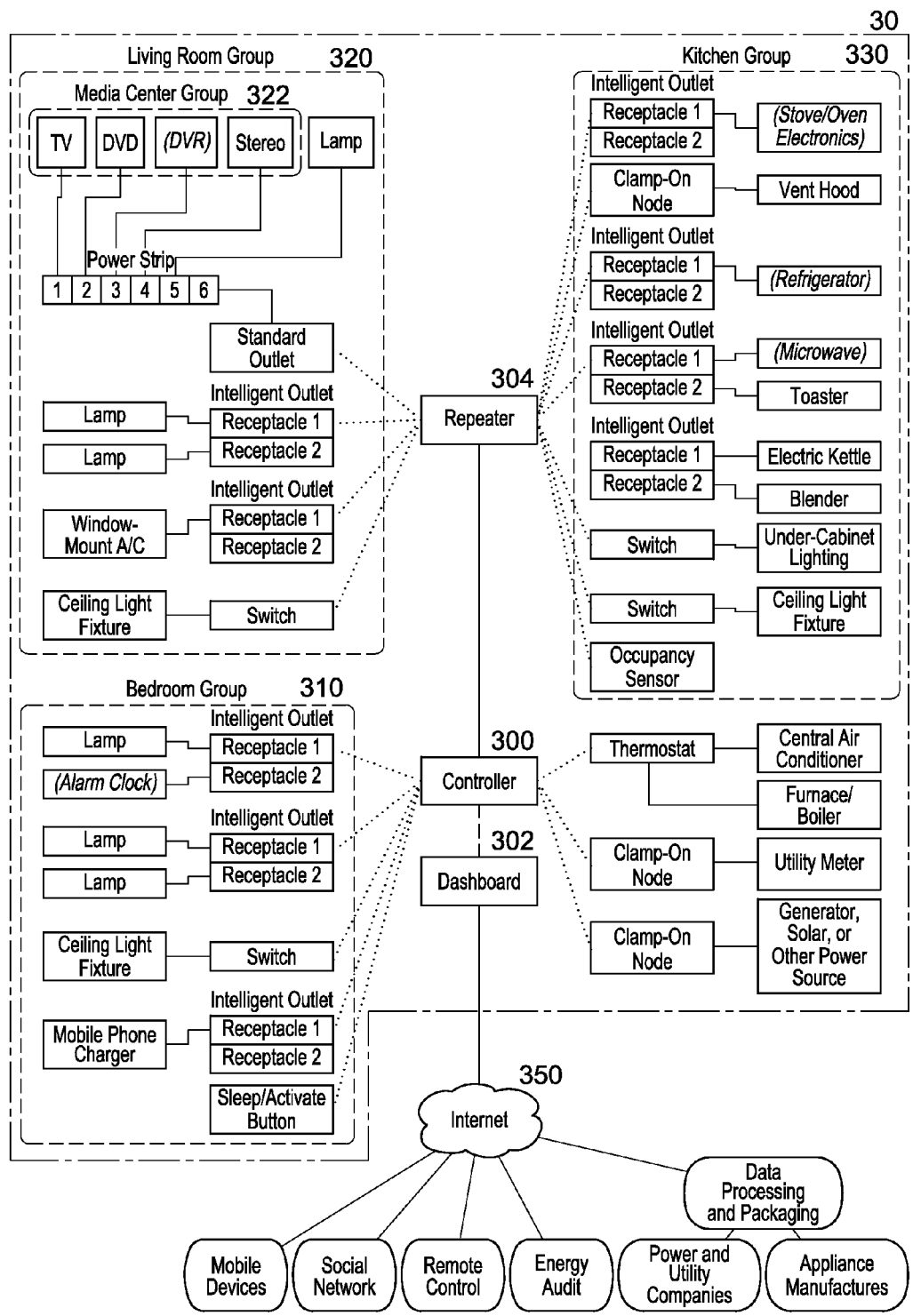
FIG. 3 shows an exemplary relational chart according to embodiments of the invention.

FIG. 3 depicts a relational chart according to embodiments of the invention. System 30 shows an example home energy network according to an embodiment of the invention. In system 30, a variety of nodes, groups, appliances, and devices are situated. In various aspects of the invention, nodes may also be embedded directly within appliances and devices, embedded directly into the wiring system of the home or building itself, or be devices able to connect to the various appliances and devices, as well as the power network in the home or building as more fully described below. By way of example, appliances and devices that may be excluded from automated switching are shown in italics and parentheses, however the exclusion of devices from the control of the controller 300 is purely optional. Groups 310, 320, and 330 are illustrative groupings of nodes that are individually controllable by controller 300. Media center group 322 is illustrative of nested sub-groupings possible by the hierarchical structure of groups according to various aspects of the present invention. In other embodiments of the invention, groups may be created through the use of tagging. Tags may be keywords or terms associated with or assigned to devices, thus describing the device and enabling a keyword-based grouping of the device with other devices. Tags may be chosen from a pre-defined list or added manually by a user or by the system itself. Tags may also be added to the predefined list, or to various devices automatically by the user community described herein. Aspects of the invention contemplate devices having multiple assigned tags so that the device may belong to any number of groups at the same time, and be controlled and monitored accordingly. Various repeaters 304 may be used in embodiments of the present invention in order to extend the reach of controller 300 to distant nodes. Further, according to some embodiments the controller may be separate from a dashboard 302, as described more fully herein. Some embodiments of the invention may connect to an Internet 350, which may consist of any type of public or private network.

Nodes

According to various aspects of the invention, the power monitoring and control nodes may be packaged in the form of common household electrical fixtures: outlets, switches, dimmers, power strips, thermostats, bulb sockets, and any other form of fixture or power-related device known to those of skill in the art. Nodes may also take the form of more industrial or commercial electrical fixtures known to those in the art. Nodes may be directed to any international standard known to those in the art. Nodes may be packaged as clamp-on current transducers to monitor current in any wire, such as the power cord for an appliance or device. Nodes may also be installed in the circuit breaker box in the form of circuit breakers, clamp-on current transducers on each circuit, or clamp-on current transducers monitoring the main electrical feed in a home or business. Nodes can also be embedded in appliances, devices, light fixtures, other data acquisition or monitoring systems, or any other power consuming or providing device known to those of skill in the art.

Figure 4A:
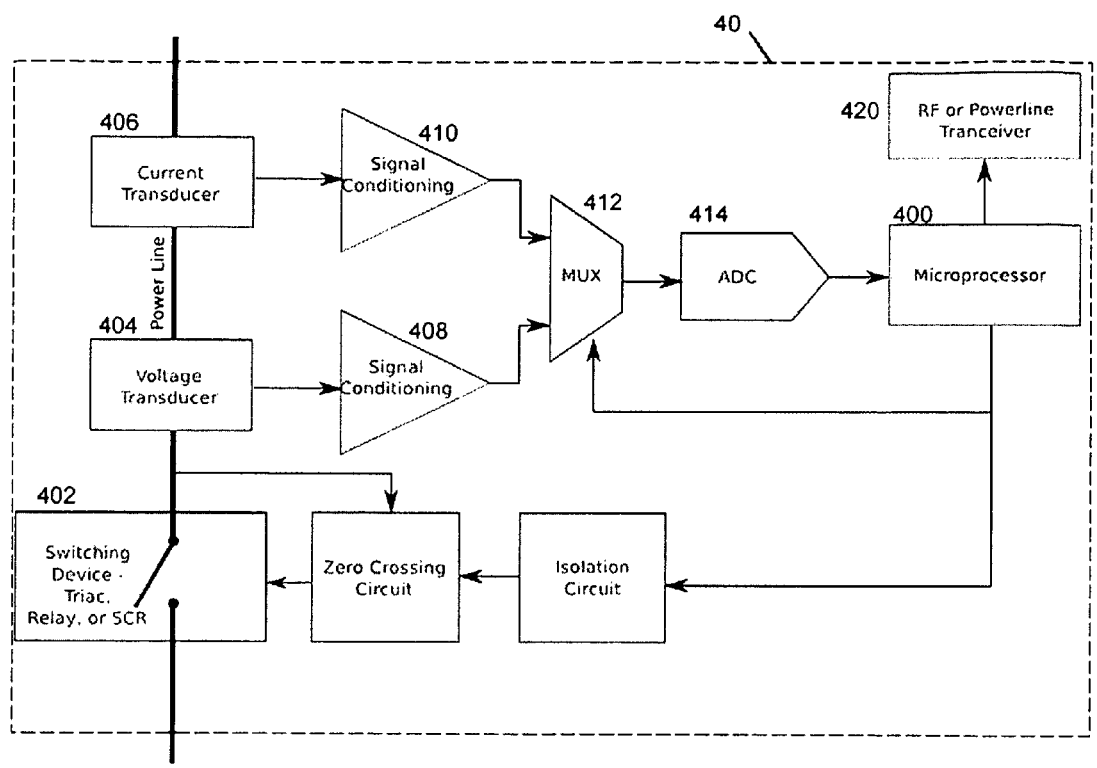
FIGS. 4a and 4b show illustrative circuits according to embodiments of the invention.
Figure 4B:
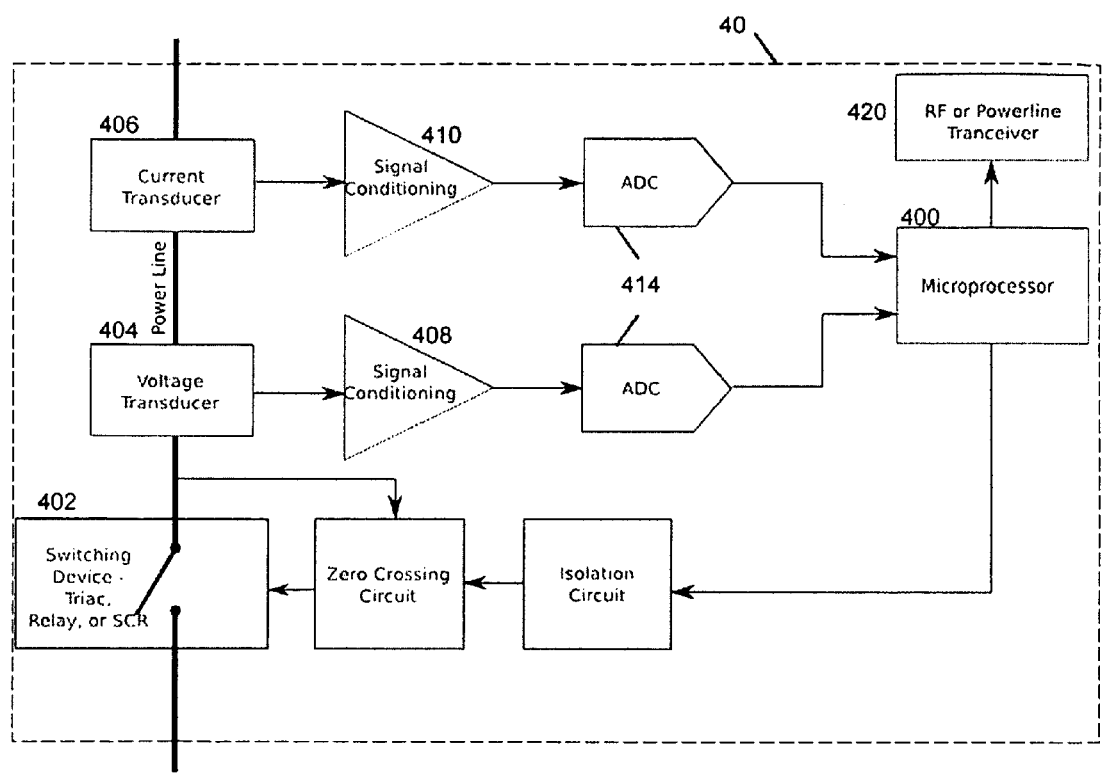

In various aspects of the invention, a node may be composed of an electronic circuit, such as a logging and control circuit, and application-specific packaging. FIG. 4a shows an illustrative circuit according to one of the various embodiments. FIG. 4b shows an alternate illustrative circuit according to another of the various embodiments. The circuit 40 may contain a microprocessor 400 and may be capable of measuring and recording electrical current and voltage; deriving, processing, and storing power data; and communicating power data over the network. The circuit may monitor the current and voltage via a voltage transducer 404 and a current transducer 406. Those measurements may then be fed through to signal conditioners 408 and 410 and into an analog-to-digital conversion circuit (ADC) 414 via a multiplexer (MUX) 412. The digitally converted signal may then be interpreted by microprocessor 400. The circuit may also be capable of controlling an attached electrical device by switching the power to said device or controlling the amount of power received by the device, and of communicating the switch state or power consumption level over the network. Communication of information to the network may be accomplished through a network transceiver 420. Nodes embedded in an appliance or other device may be able to control that devices power consumption and switch state, and be able to communicate those variables over the network. Nodes may additionally contain one or more temperature sensors, such as a thermocouple of thermistor, or any of the other types and kinds of sensors mentioned herein. Nodes may also be wired in other various configurations or using other circuitry as will be appreciated by those of skill in the art. According to other aspects of the invention, nodes and other devices in the home energy network may also monitor their own power consumption and report that information to the network and user.

Figure 5:
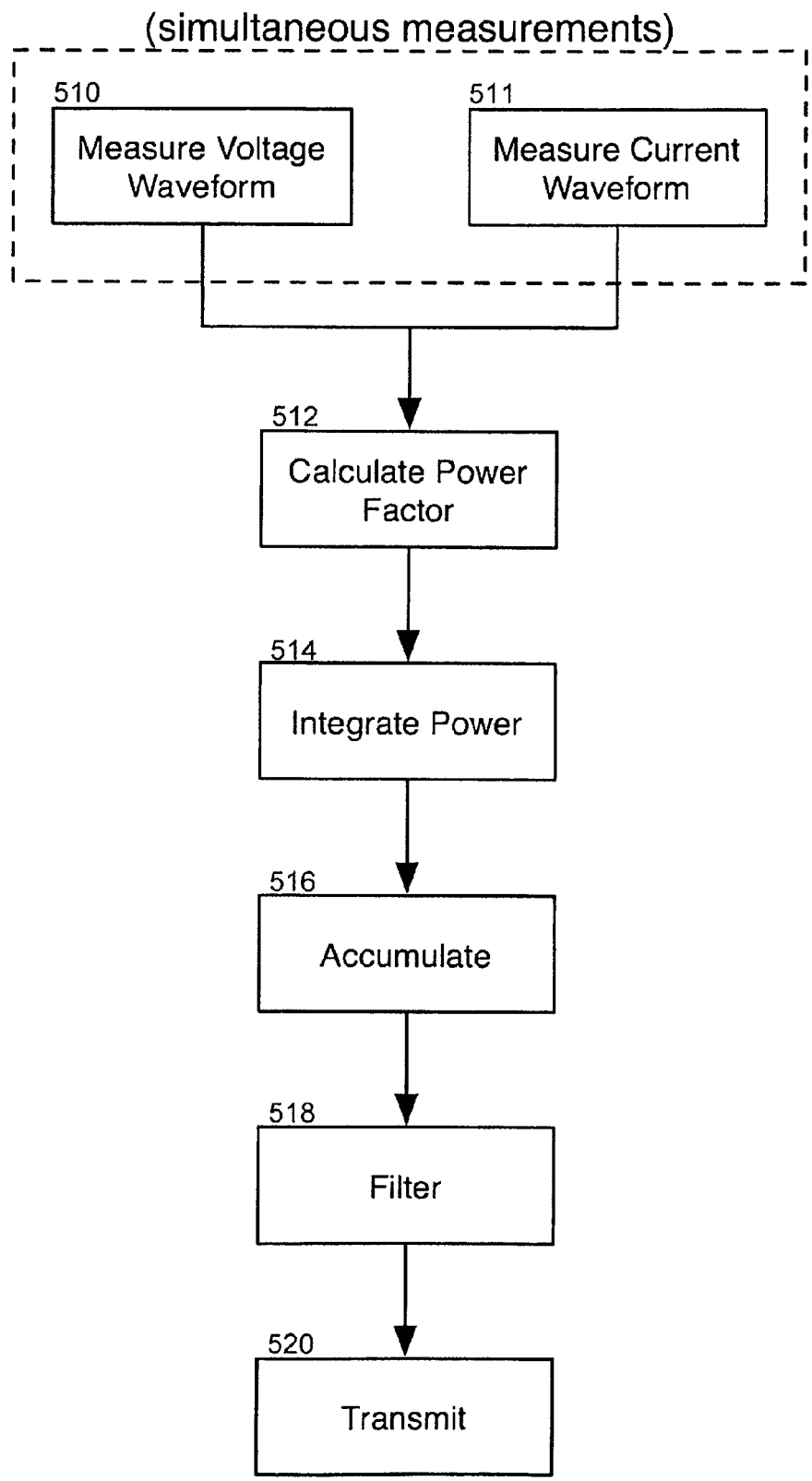
FIG. 5 shows a flow chart illustrating the power monitoring process according to embodiments of the invention.

FIG. 5 is a flow chart illustrating the power monitoring process according to some of the various embodiments of the invention. In various embodiments, this method may be utilized by the various nodes in order to determine and communicate power information to other devices on the network. The node may first capture and measure the waveforms of both the voltage, step 510, and current, step 511, passing through the node. Those voltage and current data may then be combined into a power factor value in step 512. After integrating the power values at step 514, the node may accumulate 516 and filter 518 collected data prior to transmission to the network at step 520. Of course, as the accumulation and filtering steps are not necessary, and the node may directly send monitored data without any internal processing of that data, these steps may be omitted in some embodiments. In other various embodiments, additional steps may be added, some of which may relate to further preprocessing of data before transmittal.

In various embodiments of the invention, back in FIGS. 4a-b, switching may be accomplished via a switching device 402. This device may be a relay, triac, transistor, semiconductor, or other component. Switching actions may be performed either in response to a command received over the network or via predefined conditions and behaviors stored or written internally on the circuit. Switching circuitry may also be enabled to change the level of power being sent to the device or appliance, beyond mere on and off states, such that any conceivable power level may be set by the switching circuitry. According to various aspects, the predefined conditions may have been stored internally before installation or written to internal storage, after installation, by either a controller or other application connected to the network. Predefined conditions may include the node sensing a power surge or spike, a new appliance or device being plugged in, an appliance or device entering standby mode, or an indication that the appliance or other power consuming or providing device has been moved. In the case of an electrical outlet, switch, power strip, or other power provisioning device, with multiple separate circuits, each may be treated as an individually addressable node on the network, can be controlled individually, can be mapped and identified individually, and can detect whether an individual appliance or device is plugged in, switched on or off, in an active or standby mode, or any other state information, such as a reduced power mode.

Embodiments of the invention may contemplate the various components of the invention being either directly connected as described herein, or indirectly connected through additional components or wiring systems. It should be easily realized to those of ordinary skill in the art that some of these indirect connections may be through other circuits, transistors, capacitors, networks, additional nodes or intervening devices, computers, intelligent switching or connecting systems, power networks or grids, electrical wiring, wireless protocols or technologies, or any other method of causing two components to communicate. As will be appreciated by those of ordinary skill in the art, this indirect connection and communication aspect may be applied to any of the aspects and embodiments of the invention described herein.

Figure 6:
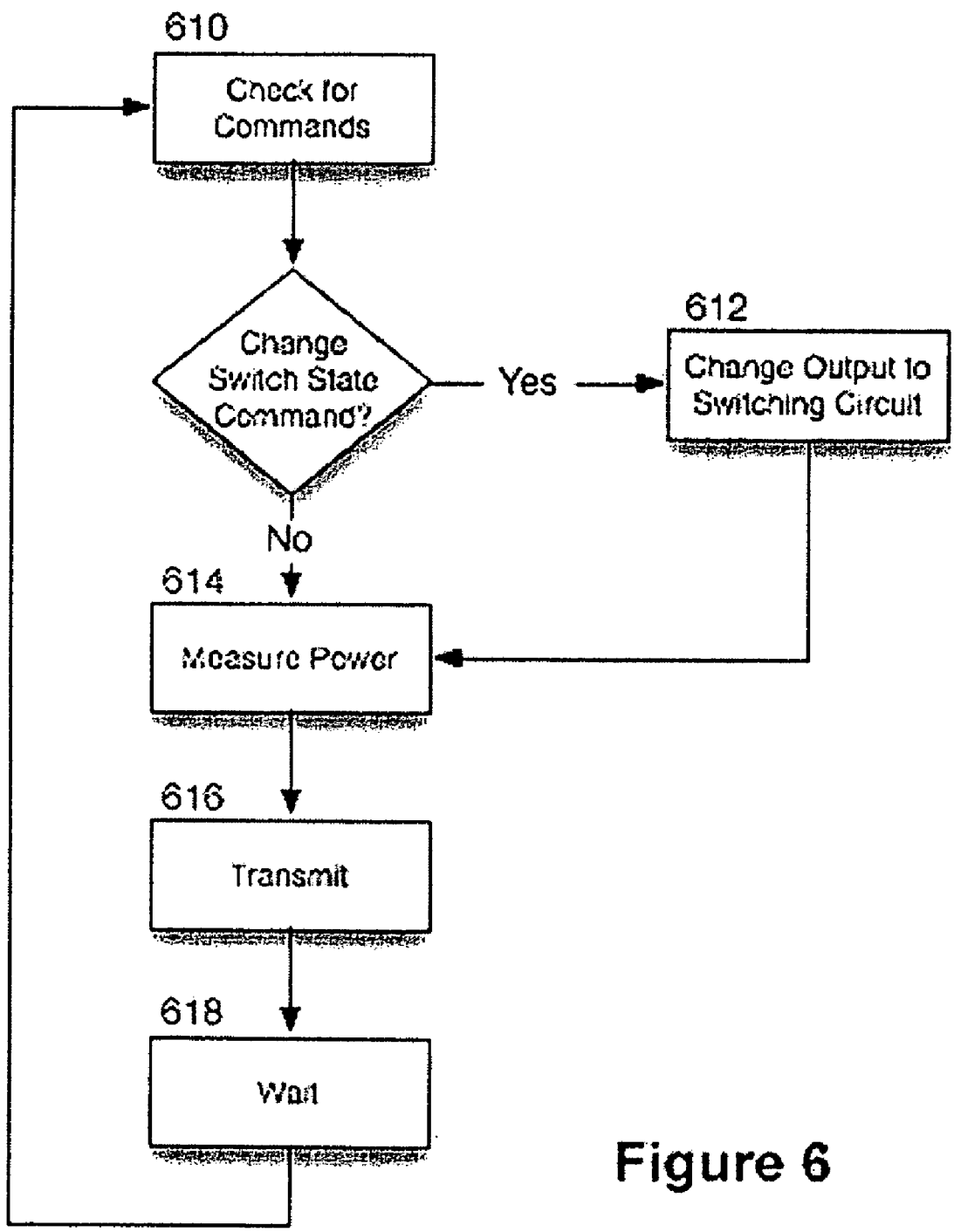
FIG. 6 shows a flow chart illustrating the switching decision process according to some of the various embodiments of the invention.

FIG. 6 is a flow chart illustrating the switching decision process according to some of the various embodiments of the invention. In various embodiments, this method may be implemented by the various nodes in order to determine when to switch power to or from a connected device, or when to change the level of power going to the device. In some aspects of the invention, commands may be sent to the node in order to instruct the node to switch a power state on or to switch a power state off. The node may receive these commands and place them in internal readable memory, such as a buffer, register, or other storage medium. Some aspects consider a timed loop in which the commands are read from storage upon the lapse of a time interval, such as a system clock tick, and then executing the command upon reading, such as in step 610. There, the node may check to see if any commands have been sent to the node, either by checking internal readable memory or by other means. Alternatively, the node may immediately act upon receipt of the commands. If a change state command has been sent to the node, the node may then change the state of the switching circuit at step 612. After commands are checked and switches are adjusted (if necessary), the system then may measure current and voltage being transmitted through the node at step 614. This may serve as a check that the proper switching state has been achieved or, in the case that throughput is being regulated at various levels, that the proper level of current or voltage is being controlled by the node. The collected data may then be either stored internally or transmitted to devices connected on the network at step 616, for either further analysis, local or system-wide diagnostics, or any other purpose disclosed herein. The system may then have a delay period 618, either predetermined, programmed, selected, or dependent upon other factors, before checking for commands again. Other embodiments and aspects of the invention may use a process similar to that in FIG. 6 for controlling the level of voltage or current being passed through the node, or other power level controls described herein.

In the various embodiments of the invention, nodes may be configured to communicate stored or real-time power data and internal switching states at regular or irregular intervals, when certain optional conditions are met, or when polled. Polling may be performed by the controller or repeater, a computer connected to the network, a mobile device, a remote control, a computer or server connected to the network through a wide-area network such as the Internet, or any other nodes or network connected device. Regular intervals may be on the order of less than a second, or one or more seconds, minutes, hours, days, weeks, months, or years. Irregular intervals may be random or change over time; for example, when a node is reset by a user or system command, or detects a new appliance or device plugged in, or senses activity in a connected appliance or device, the node may initially send a constant stream of data for a short period of time and then send data less often as time passes. The change in interval length may occur in a linear, nonlinear, exponential, stepwise, or arbitrary fashion. Intervals may be synchronous or asynchronous with other nodes. Other aspects contemplate a manual initiation of the polling procedure by a user through the controller, dashboard, a remote device connected to the network through a wide-area network such as the Internet, or any user interface described herein.

In some aspects of the invention, nodes may communicate power data, switching state, status data, or any other sensor information to controllers, displays, other nodes, or any other device connected to the network, continually, intermittently, or when predefined conditions are met. Predefined conditions for the communication of data may include a user override event, a switch or button activation (on either the node or device connected to the node) by the user, a power surge or spike, an appliance or device being plugged in to an outlet, a light bulb burning out, a certain instantaneous or average power level on an attached appliance or device being reached, a certain quantity of W-hr or kW-hr consumed by an attached appliance or device, or standby or active mode being detected in an attached device. Other types of data and predefined conditions available to the system will be appreciated by those in the art.

Various aspects and embodiments of the invention contemplate nodes that contain ports, processors, switches, or memory modules. Ports may be any type of device, communications bus, network connection, or other device that allows or provides communication from the node to any other component or device, whether in the described invention or beyond. Processors may consist of circuitry, conventional processors, registers, calculators, algorithms, subroutines, or any other method of analyzing or manipulating data. Switches may be any of the types of switches described above, or further herein, such as a circuit to enable or disable the flow of power. Memory modules may consist of any type of memory device, such as random-access memory, read-only memory, flash memory chips, processor registers, caches, hard disks, readable or writable optical or tape storage, capacitors, other circuitry, or any other type of device known to those of skill in the art.

Electrical Outlet with Integrated Logging and Control Circuit

Figure 7:
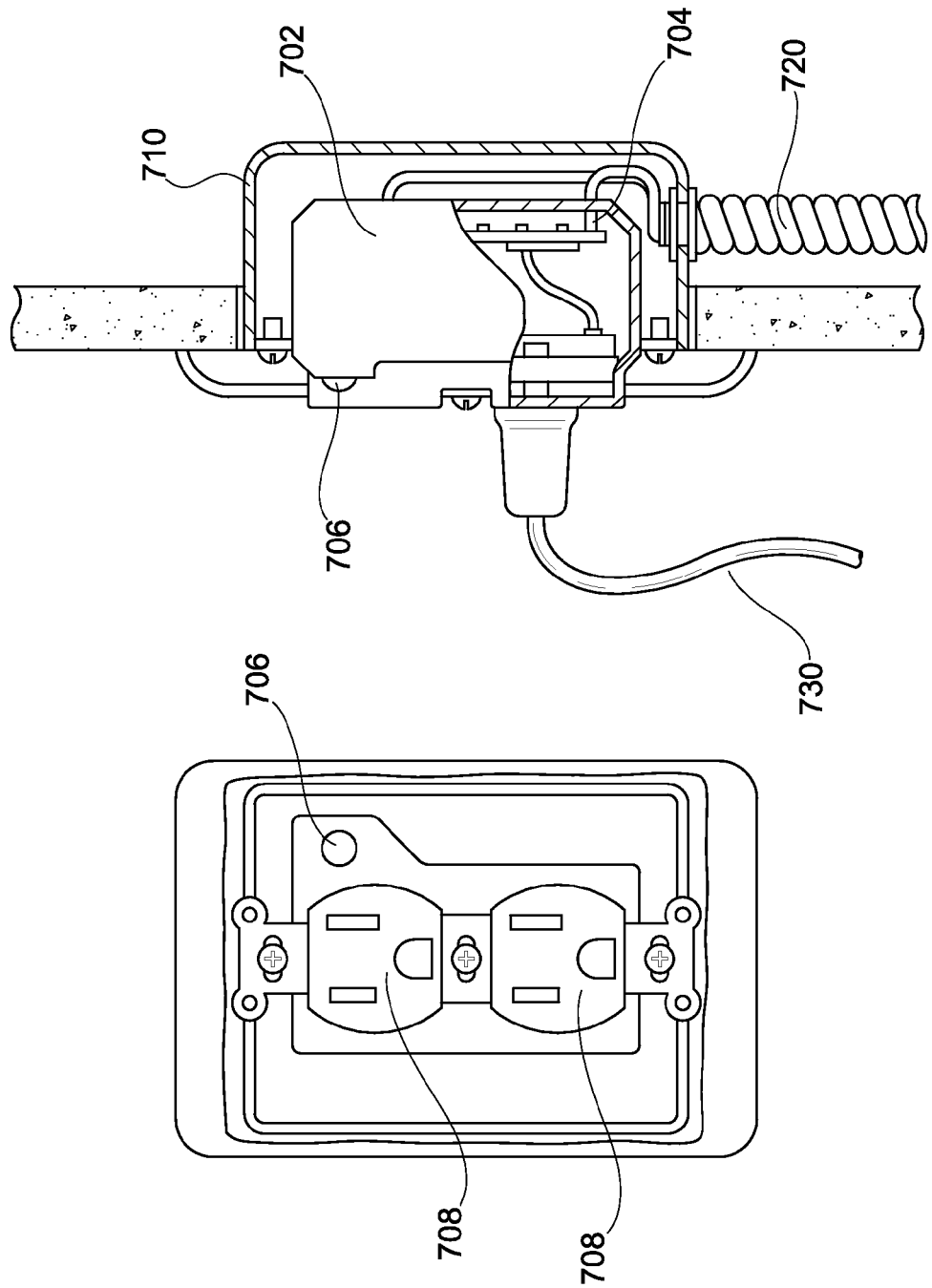
FIGS. 7-17 show nodes according to various embodiments of the present invention.

FIG. 7 illustrates an electrical outlet node with an integrated logging and control circuit according to various embodiments of the present invention. This node may consist primarily of a monitoring and control unit 702, connected to a printed circuit board 704 and an on/off button 706. The node preferably fits in a standard junction box 710, or alternatively may replace the junction box, and may be connected to the home or office wiring 720. In various embodiments, each receptacle may be individually monitored and/or switched. Button 706 may allow a user to conduct a temporary override of the node, overriding the energy network system as more fully described below. Other embodiments of the invention may provide a button for each of the outlets on a receptacle, such as outlets 708 and 709 in the exemplary FIG. 7. In other embodiments, the button may be replaced with a switch, dimmer, or other mechanism for controlling the node. Receptacles, individually or together, may contain a switch or other sensor to detect when an appliance or device is plugged in (as in 730), when the device or appliance is drawing power, or when the device or appliance has entered a standby or other mode. The receptacle may be configured to automatically switch off power in the absence of anything plugged in. This aspect of the invention acts as a safety feature to reduce the risk of electrocution inherent in any electrical fixture (e.g., when a child inserts a finger into an outlet).

According to various aspects of the invention, the node may also contain a location-determining sensor. The sensor may be based upon global positioning system (GPS) technology, the triangulation of wireless signals, powerline networking, other network-based location technology, or any other location-based technology, or manually input into the system. The node may transmit its location along with any information about the controlled device or appliance and monitoring and control data to the network for use by the system. In other aspects, the nodes may interpret or acquire control signals or commands directed to the location the node is presently connected.

According to various aspects of the invention, the node may also contain appliance or device determining sensors. These sensors may be based upon radio frequency identification (RFID) technology, other electronic signatures or identifications emanating from the device or appliance, a power signature or profile of the appliance or device, or a manual or automatic pairing process between the appliance or device and the node. The node may transmit the identity of the connected appliance or device, along with any other information previously described, to the network for use by the system. In other aspects, the nodes may interpret or acquire control signals or commands directed to the type of appliance or device connected, or the specific appliance or device connected.

Wall Switch with Embedded Logging and Control Circuit

Figure 8:
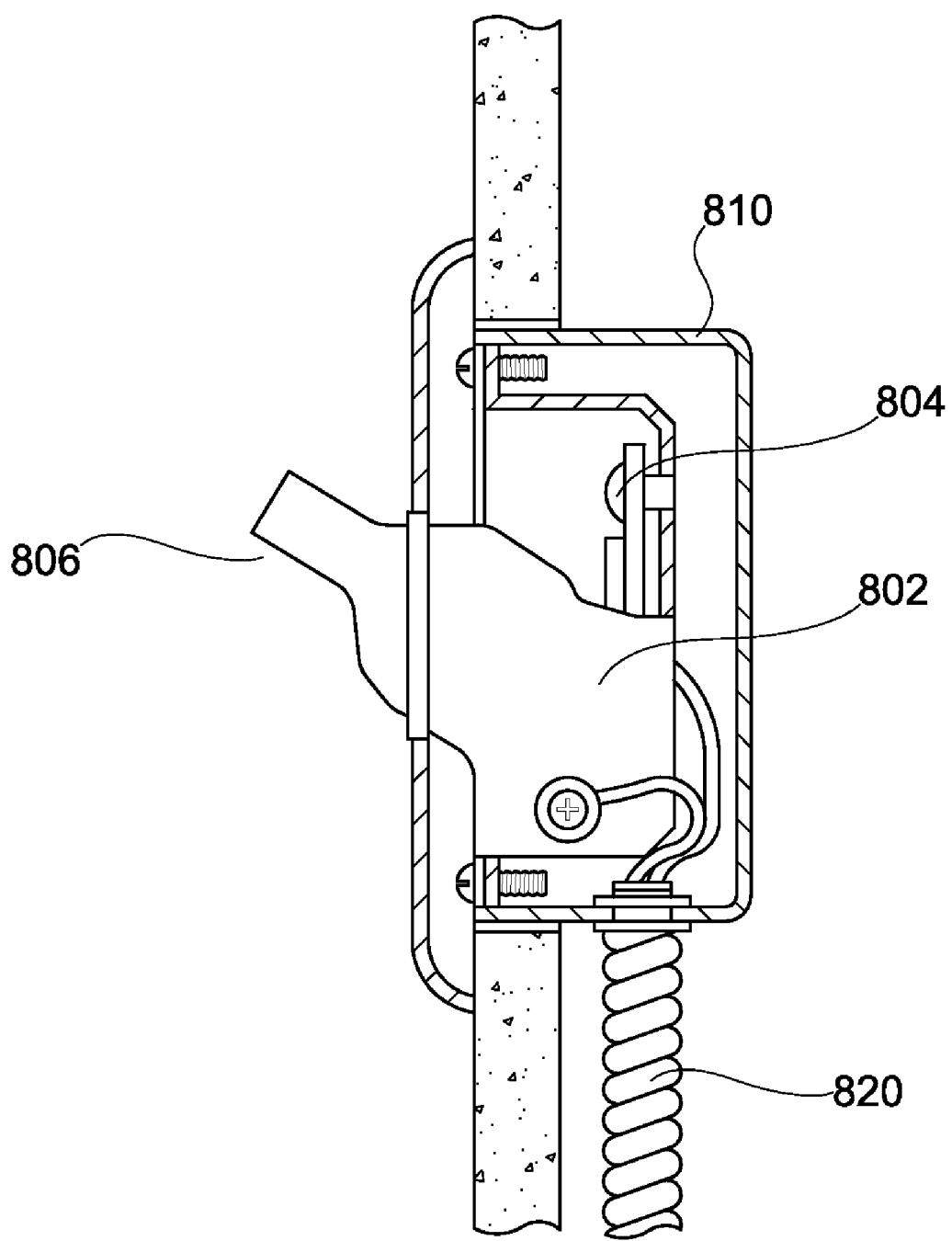

FIG. 8 illustrates an electrical wall switch node with an integrated logging and control circuit according to various embodiments of the present invention. This node may consist primarily of a monitoring and control unit 802, connected to a printed circuit board 804 and an on/off switch lever 806. This node preferably fits in a standard junction box 810, or alternatively replaces the junction box, and is connected to the home or office wiring 820. In various embodiments, the junction box may contain multiple switch levers. In still other embodiments, the switch lever 806 may be replaced with a dimmer switch or other power switching mechanisms known to those in the art. The wall switch node may additionally contain an internal switch or other sensor to detect when an appliance or device is plugged into an outlet controlled by the wall switch node, when the device or appliance is drawing power from the outlet, or when the device or appliance has entered a standby or other mode. The node may be configured to automatically switch off power to the outlet controlled by the wall switch node in the absence of anything plugged in. According to various aspects of the invention, the inline outlet node may also contain a location-determining sensor. The sensor may be based upon global positioning system (GPS) technology, the triangulation of wireless signals, powerline networking, other network-based location technology, or any other location-based technology, or manually input into the system. The node may transmit its location along with any information about the controlled device or appliance and monitoring and control data to the network for use by the system. In other aspects, the nodes may interpret or acquire control signals or commands directed to the location the node is presently connected.

According to various aspects of the invention, the node may also contain appliance or device determining sensors. These sensors may be based upon radio frequency identification (RFID) technology, other electronic signatures or identifications emanating from the device or appliance, a power signature or profile of the appliance or device, or a manual or automatic pairing process between the appliance or device and the node. The node may transmit the identity of the connected appliance or device, along with any other information previously described, to the network for use by the system. In other aspects, the nodes may interpret or acquire control signals or commands directed to the type of appliance or device connected, or the specific appliance or device connected.

Inline Outlet with Embedded Logging and Control Circuit

Figure 9:
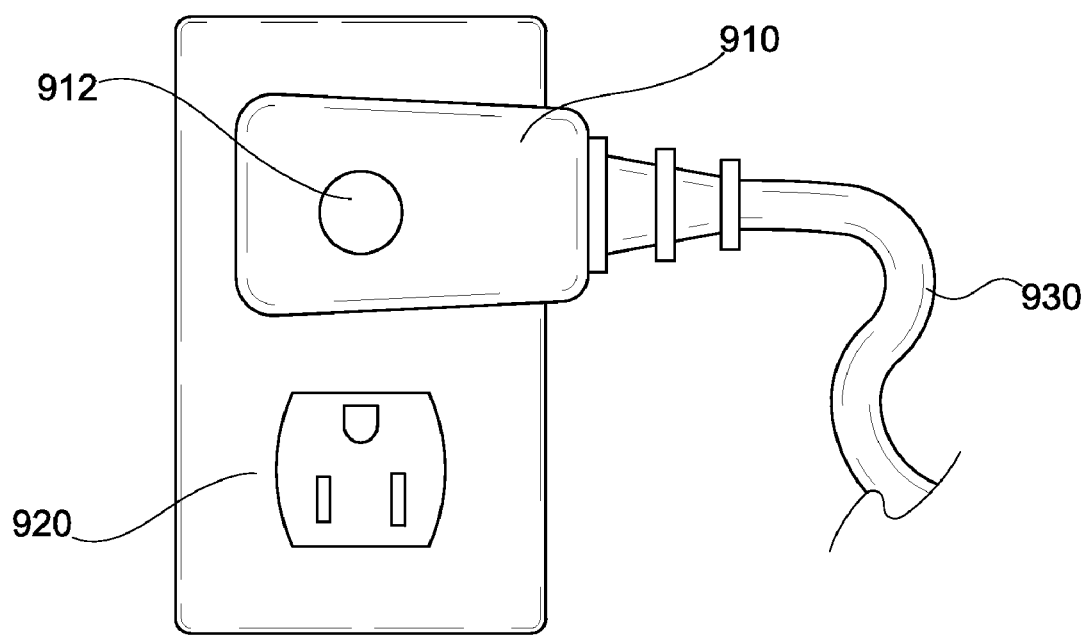

FIG. 9 illustrates an inline outlet node with an embedded logging and control circuit according to various embodiments of the present invention. The plug-in node 910 may consist primarily of an internal monitoring and control unit and an on/off button 912. The node may plug into a standard outlet 920 and provides a receptacle to receive a plug of a device or appliance 930. In various embodiments, the inline outlet node may have multiple receptacles in which to plug multiple devices or appliances, while the node itself plugs into only one outlet socket. In other embodiments, the inline outlet node may have multiple receptacles in which to plug multiple devices or appliances, while the node itself can plug into multiple outlet sockets. In some aspects, the number of receptacles on the node may equal the number of outlets the node plugs into, while in other aspects, there may be a disproportionate number of receptacles available and outlets used. In various embodiments, each receptacle may be individually monitored and/or switched. Button 912 may allow a user to conduct a temporary override of the node, overriding the energy network system as more fully described below. Other embodiments of the invention may provide a button for each of the receptacles available for devices or appliances. In other embodiments, the button may be replaced with a switch, dimmer, or other mechanism for controlling the node. Receptacles, individually or together, may contain a switch or other sensor to detect when an appliance or device is plugged in, when the device or appliance is drawing power, or when the device or appliance has entered a standby or other mode. The receptacle may be configured to automatically switch off power in the absence of anything plugged in.

According to various aspects of the invention, the inline outlet node may also contain a location-determining sensor. The sensor may be based upon global positioning system (GPS) technology, the triangulation of wireless signals, powerline networking, other network-based location technology, or any other location-based technology. The node may transmit its location along with any information about the controlled device or appliance and monitoring and control data to the network for use by the system. In other aspects, the nodes may interpret or acquire control signals or commands directed to the location the node is presently connected.

According to various aspects of the invention, the inline outlet node may also contain appliance or device determining sensors. These sensors may be based upon radio frequency identification (RFID) technology, other electronic signatures or identifications emanating from the device or appliance, a power signature or profile of the appliance or device, or a manual or automatic pairing process between the appliance or device and the node. The node may transmit the identity of the connected appliance or device, along with any other information previously described, to the network for use by the system. In other aspects, the nodes may interpret or acquire control signals or commands directed to the type of appliance or device connected, or the specific appliance or device connected.

Power Strip with Embedded Logging and Control Circuit

Figure 10:
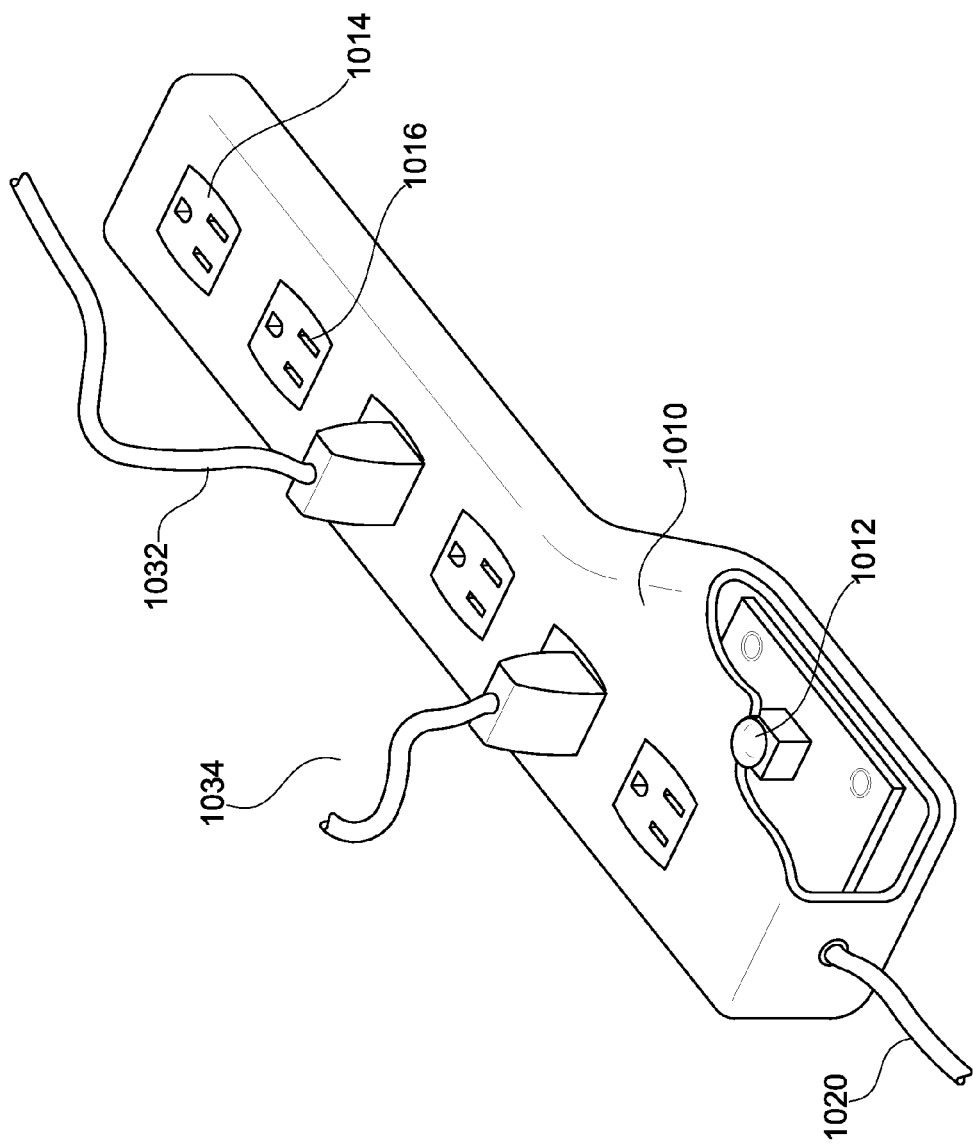

FIG. 10 illustrates a power strip node with an embedded logging and control circuit according to various embodiments of the present invention. The power strip node 1010 may consist primarily of an internal monitoring and control unit, an on/off button 1012, and multiple outlet receptacles 1014-1016. The node may plug into a standard outlet using a fixed cord 1020 and provides the multiple receptacles to receive plugs of devices or appliances 1032-1034. In various embodiments, the power strip node may have a varying number of receptacles in which to plug multiple devices or appliances, such as 2, 4, 6, 8, or 10. In various embodiments, power strip nodes may be plugged into other power strip nodes in order to create more available outlet receptacles. There, the first power strip node may recognize a subsequent power strip node plugged into a receptacle and pass control and monitoring information and commands through to the subsequent power strip and back to the network. In various embodiments, each receptacle may be individually monitored and/or switched. Button 1012 may allow a user to conduct a temporary override of the node, overriding the energy network system as more fully described below. Other embodiments of the invention may provide a button for each of the receptacles available for devices or appliances. In other embodiments, the button may be replaced with a switch, dimmer, or other mechanism for controlling the node. Receptacles, individually or together, may contain a switch or other sensor to detect when an appliance or device is plugged in, when the device or appliance is drawing power, or when the device or appliance has entered a standby or other mode. The receptacle may be configured to automatically switch off power in the absence of anything plugged in.

According to various aspects of the invention, the node may also contain a location-determining sensor. The sensor may be based upon global positioning system (GPS) technology, the triangulation of wireless signals, powerline networking, other network-based location technology, or any other location-based technology. The node may transmit its location along with any information about the controlled device or appliance and monitoring and control data to the network for use by the system. In other aspects, the nodes may interpret or acquire control signals or commands directed to the location the node is presently connected.

According to various aspects of the invention, the node may also contain appliance or device determining sensors. These sensors may be based upon radio frequency identification (RFID) technology, other electronic signatures or identifications emanating from the device or appliance, a power signature or profile of the appliance or device, or a manual or automatic pairing process between the appliance or device and the node. The node may transmit the identity of the connected appliance or device, along with any other information previously described, to the network for use by the system. In other aspects, the nodes may interpret or acquire control signals or commands directed to the type of appliance or device connected, or the specific appliance or device connected.

Bulb Socket with Embedded Logging and Control Circuit

Figure 11:
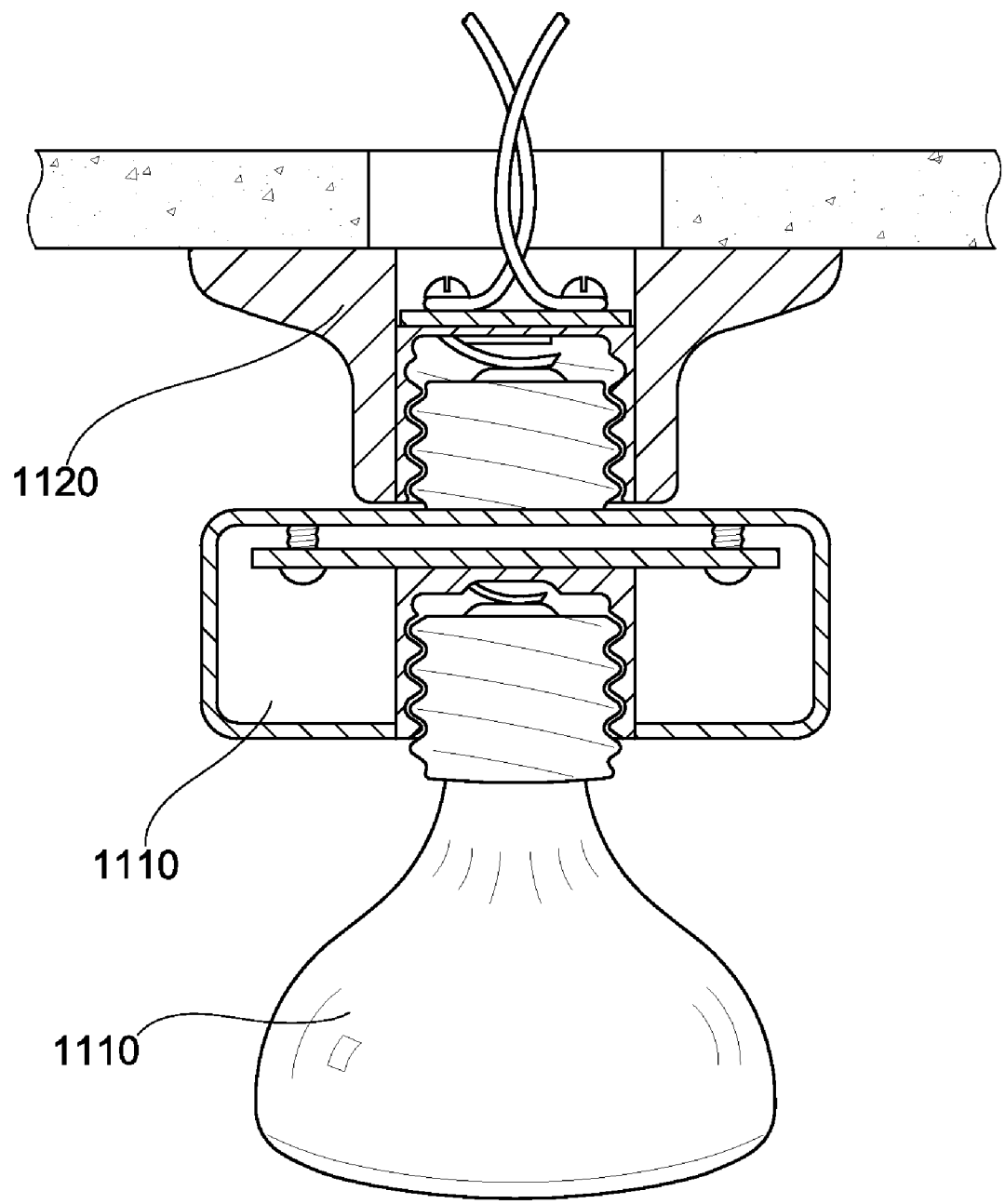

FIG. 11 illustrates a bulb socket node with an embedded logging and control circuit according to various embodiments of the present invention. The bulb socket node 1110 may consist primarily of an internal monitoring and control unit, an optional on/off button, and a bulb receptacle. The node may plug into a standard light fixture 1120 and provides a standard bulb receptacle to receive a light bulb 1130. In various embodiments, the bulb socket node may have a two or more light bulb receptacles in which to plug multiple light bulbs. In those embodiments, each receptacle may be individually monitored and/or switched. An optional button, pull-chain, or other switch may allow a user to conduct a temporary override of the node, overriding the energy network system as more fully described below. Other embodiments of the invention may provide a button, pull-chain, or other switch for each of the receptacles available for light bulbs. Receptacles, individually or together, may contain a switch or other sensor to detect when a bulb or other device is plugged in, when the bulb or other device is drawing power, or when the bulb or other device has entered a standby or other mode. The receptacle may be configured to automatically switch off power in the absence of anything plugged in. The node may also be able to monitor, measure, and control the intensity of light emanating from the attached light bulb(s).

According to various aspects of the invention, the node may also contain a light-sensing sensor. The sensor may be based upon photo-multiplier tubes, photo-diodes, photo-transistors, CdS photocells, or other light-sensing devices known to those in the art. The node may transmit sensed light information along with any information about the controlled bulb or device and monitoring and control data to the network for use by the system. In various aspects of the invention, the node may adjust the intensity of the light emitting from the light bulb based upon data gathered from the light-sensing sensor. In various aspects, user settings, the time of day, environmental factors such as daylight hours are also taken into account by the node and system.

According to various aspects of the invention, the node may also contain a location-determining sensor. The sensor may be based upon global positioning system (GPS) technology, the triangulation of wireless signals, powerline networking, other network-based location technology, or any other location-based technology. The node may transmit its location along with any information about the controlled bulb or device and monitoring and control data to the network for use by the system. In other aspects, the nodes may interpret or acquire control signals or commands directed to the location the node is presently connected.

According to various aspects of the invention, the node may also contain bulb or device determining sensors. These sensors may be based upon radio frequency identification (RFID) technology, other electronic signatures or identifications emanating from the device or bulb, a power signature or profile of the bulb or device, or a manual or automatic pairing process between the bulb or device and the node. The node may transmit the identity of the connected bulb or device, along with any other information previously described, to the network for use by the system. In other aspects, the nodes may interpret or acquire control signals or commands directed to the type of bulb or device connected, or the specific bulb or device connected.

Thermostat with Embedded Logging and Control Circuit

Figure 12:
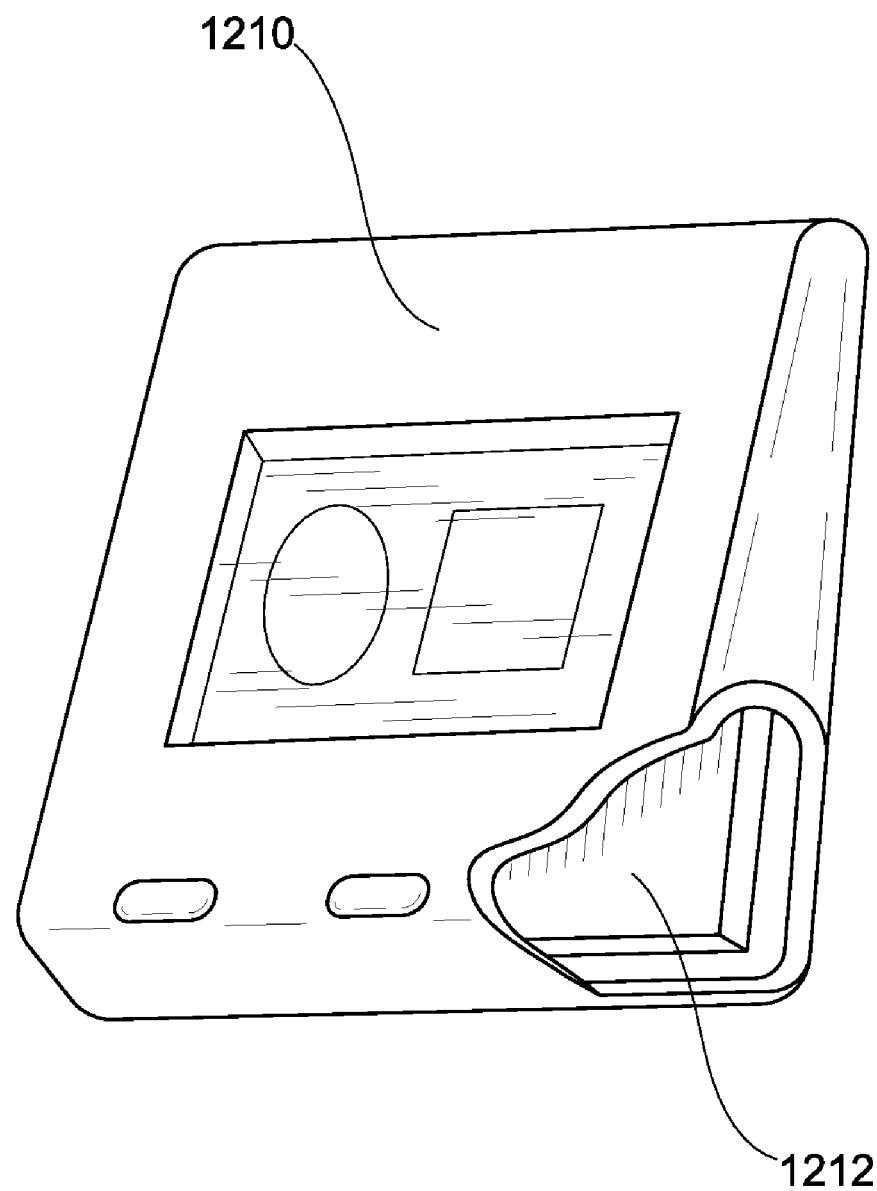

FIG. 12 illustrates a thermostat node with an embedded logging and control circuit according to various embodiments of the present invention. The thermostat node may consist primarily of an internal monitoring and control unit 1212 attached to or enclosed in a wall-mounted thermostat 1210. As some thermostats, in various embodiments, may not power the HVAC systems they control, electrical power is not necessarily monitored in this node. In some embodiments of the invention, the thermostat node may be paired with another corresponding node (such as a circuit breaker node, a clamp-on current transducer node, or any other hardwired node) in order to monitor and control power going into the HVAC system controlled by the thermostat node. These corresponding nodes may communicate information with each other, or with a controller or other device on the network, in order to control the HVAC system. According to various aspects of the invention, the thermostat may record and transmit its user-defined settings (e.g., temperature set-points) and data on when it calls for heating/cooling from the HVAC system. In various aspects, the thermostat's settings may be modified remotely by the controller.

According to other various embodiments, a thermostat node may be connected or attached to a water heater. This thermostat may be similar to that in FIG. 12. A water heater thermostat node may be able to control the switching of the electronic control portion of a gas-fired water heater, the switching of the heating element of an electric water heater, the switching of an entire electric water heater, or modifying the setpoint for the internal water temperature of a water heater. In the latter event, the water may be maintained at a minimum temperature in order to ensure warm water availability at all times, while only adjusting the temperature to a nominal hot level during typical times of use.

Circuit Breaker with Embedded Logging and Control Circuit

Figure 13:
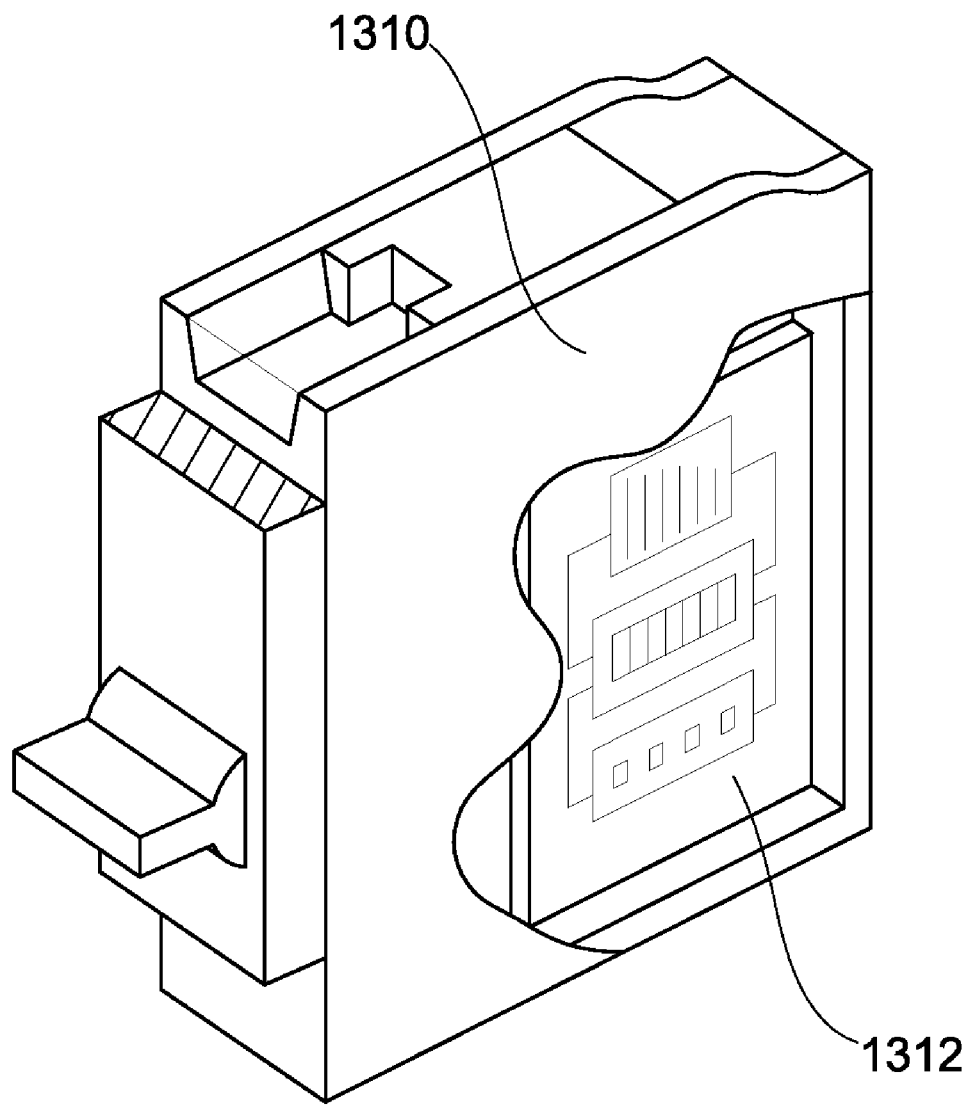

FIG. 13 illustrates a circuit breaker node with an embedded logging and control circuit according to various embodiments of the present invention. The circuit breaker node may consist primarily of an internal monitoring and control unit 1312, attached to or embedded in a circuit breaker housing 1310. The node may plug into a standard breaker box using a contacts on the housing 1310. A switch or button on the housing 1310 may allow a user to conduct a temporary override of the node, overriding the energy network system as more fully described below. The internal monitoring and control unit 1312 may contain a switch or other sensor to detect when appliances or devices are plugged in to the circuit, when devices or appliances are drawing power from the circuit, or when devices or appliances have entered a standby or other mode on the circuit. The circuit breaker node may be configured to automatically switch off power to the circuit in the absence of anything plugged in.

According to various aspects of the invention, the node may also contain a location-determining sensor. The sensor may be based upon global positioning system (GPS) technology, the triangulation of wireless signals, powerline networking, other network-based location technology, or any other location-based technology, or manually input into the system. The node may transmit its location along with any information about the controlled device or appliance and monitoring and control data to the network for use by the system. In other aspects, the nodes may interpret or acquire control signals or commands directed to the location the node is presently connected.

According to various aspects of the invention, the node may also contain appliance or device determining sensors. These sensors may be based upon radio frequency identification (RFID) technology, other electronic signatures or identifications emanating from the device or appliance, a power signature or profile of the appliance or device, or a manual or automatic pairing process between the appliance or device and the node. The node may transmit the identity of the connected appliance or device, along with any other information previously described, to the network for use by the system. In other aspects, the nodes may interpret or acquire control signals or commands directed to the type of appliance or device connected, or the specific appliance or device connected.

Clamp-On Current Transducer with Embedded Logging and Communication Circuit

Figure 14:
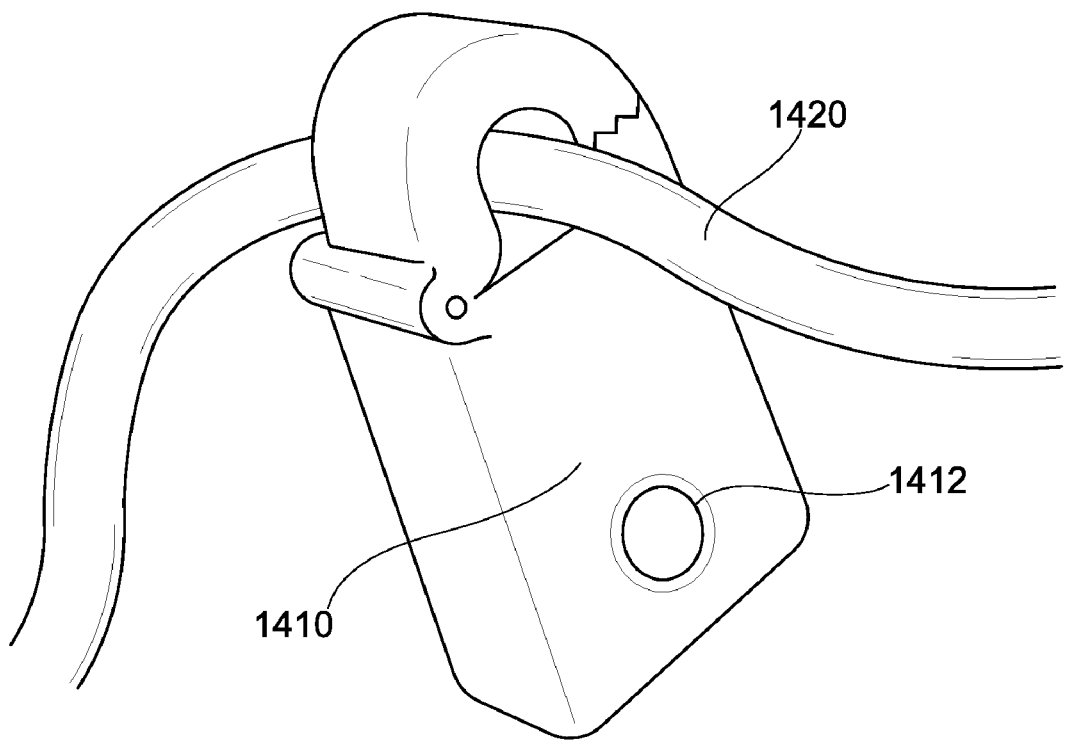

FIG. 14 illustrates a clamp-on current transducer node according to various embodiments of the present invention. The clamp-on current transducer node 1410 may consist primarily of an internal monitoring and communication unit and an on/off button 1412. The node may be clamped on to a power line/wire 1420. The clamp-on current transducer node may monitor current in any wire, including the main electrical feed in a home or office, feeds from alternative sources of energy, a single circuit inside or emerging from a breaker box, or any hardwired appliance or device. In various embodiments of the invention, alternative sources of energy may include generators; photovoltaic or other solar power systems; and wind, hydroelectric, and geothermal power systems. In aspects of the invention, this node may not have switching capability. In some embodiments of the invention, the node may be paired with another corresponding node (such as a circuit breaker node or any other control node) in order to control power going through wire 1420. These corresponding nodes may communicate information with each other, or with a controller or other device on the network, in order to control the power going through wire 1420. In some of these embodiments, the button 1412 may act in concert with any corresponding nodes to allow a user to conduct a temporary override of the node, overriding the energy network system as more fully described below. In various embodiments of the invention, the clamp-on current transducer node may be powered separately via batteries or power leads.

According to various aspects of the invention, the node may also contain a location-determining sensor. The sensor may be based upon global positioning system (GPS) technology, the triangulation of wireless signals, powerline networking, other network-based location technology, or any other location-based technology. The node may transmit its location along with any information about the controlled device or appliance and monitoring and control data to the network for use by the system. In other aspects, the nodes may interpret or acquire control signals or commands directed to the location the node is presently connected.

According to various aspects of the invention, the node may also contain appliance or device determining sensors. These sensors may be based upon radio frequency identification (RFID) technology, other electronic signatures or identifications emanating from the device or appliance, a power signature or profile of the appliance or device, or a manual or automatic pairing process between the appliance or device and the node. The node may transmit the identity of any appliance or device powered by wire 1420, along with any other information previously described, to the network for use by the system. In other aspects, the nodes may interpret or acquire control signals or commands directed to the category of appliance or device connected, such as a consumer electronics device or lighting device, or the specific appliance or device connected, such as the DVD player or microwave.

Pass-Through Power Monitor with Embedded Logging and Communications Circuit

Figure 15:
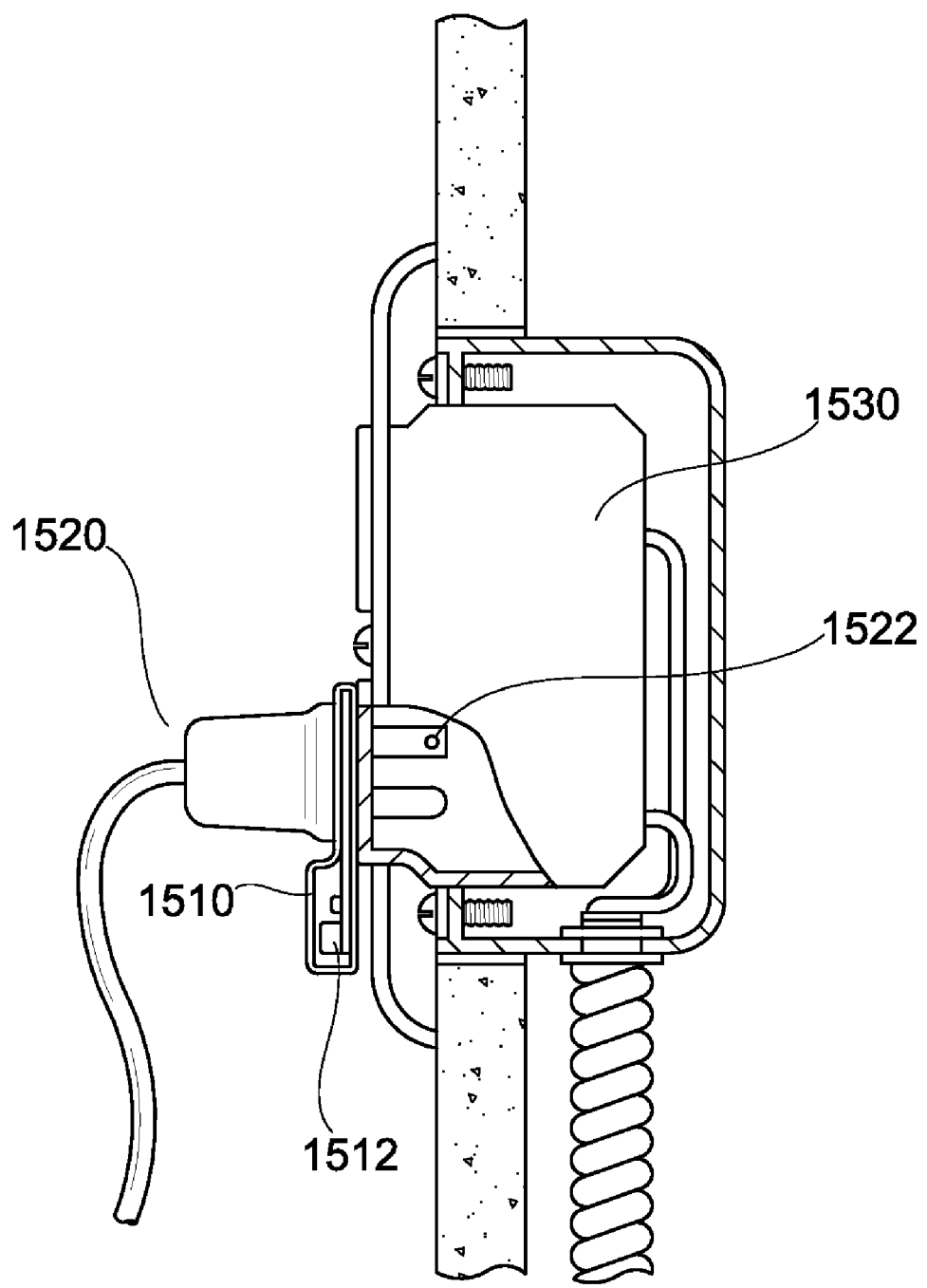

FIG. 15 illustrates a pass-through node with an embedded logging and communications circuit according to various embodiments of the present invention. The pass-through node 1510 may consist primarily of an internal monitoring and communication unit 1512 and an optional on/off button. The node may be positioned between a power plug 1520 and a standard electrical outlet 1530. The pass-through section of the node is very thin to minimize the effective amount of length lost by the plug's blades 1522. In some of the various embodiments, with the pass-through node in place, the appliance or device's power plug inserts normally into a standard receptacle. The node may contain a monitoring and communication circuit that makes contact with one or more pins or blades, and/or a circuit containing one or more windings of a conductor around one or more pins or blades. These circuits enable the pass-through node to measure the voltage and current running to the appliance or device without connecting measurement equipment in series with the power plug. In various embodiments, the pass-through node may have multiple receptacles in which to plug multiple devices or appliances through. In various embodiments, each pass-through receptacle may be individually monitored. In aspects of the invention, this node may not have switching capability. In some embodiments of the invention, the node may be paired with another corresponding node (such as a circuit breaker node or any other control node) in order to control the attached appliance or device. These corresponding nodes may communicate information with each other, or with a controller or other device on the network, in order to control the attached appliance or device. In some of these embodiments, an optional button may act in concert with any corresponding nodes to allow a user to conduct a temporary override of the node, overriding the energy network system as more fully described below. In various embodiments of the invention, the pass-through node may be powered separately via batteries or through the connection with the standard outlet and appliance or device's completed circuit. Other embodiments of the invention may provide a button for each of the receptacles available for devices or appliances, if multiple pass-through receptacles are present. In other embodiments, the button may be replaced with a switch, dimmer, or other mechanism for controlling the attached appliance or device. Receptacles, individually or together, may contain a switch or other sensor to detect when an appliance or device is plugged in, when the device or appliance is drawing power, or when the device or appliance has entered a standby or other mode. The node may be configured to automatically switch off power in the absence of anything plugged in, through collaboration with a corresponding control node.

According to various aspects of the invention, the pass-through node may also contain a location-determining sensor. The sensor may be based upon global positioning system (GPS) technology, the triangulation of wireless signals, powerline networking, other network-based location technology, or any other location-based technology. The node may transmit its location along with any information about the controlled device or appliance and monitoring and control data to the network for use by the system. In other aspects, the nodes may interpret or acquire control signals or commands directed to the location the node is presently connected.

According to various aspects of the invention, the pass-through node may also contain appliance or device determining sensors. These sensors may be based upon radio frequency identification (RFID) technology, other electronic signatures or identifications emanating from the device or appliance, a power signature or profile of the appliance or device, or a manual or automatic pairing process between the appliance or device and the node. The node may transmit the identity of the connected appliance or device, along with any other information previously described, to the network for use by the system. In other aspects, the nodes may interpret or acquire control signals or commands directed to the type of appliance or device connected, or the specific appliance or device connected.

Other Node Types

In various aspects and embodiments of the invention, other node types may include nodes that provide an interface with independent data acquisition, monitoring, or control systems, such as those that manage solar power and battery storage systems, nodes that monitor natural gas devices and pipelines entering the home or business, and other nodes embedded within appliances or devices. Other types of nodes that may be available include natural gas and water monitoring nodes, that may log the amount of utility brought into the system, the amount of the utility consumed, and how the utility was consumed. Still other nodes may monitor flow, temperature, pressure, or other information regarding utility usage points such as sinks, showers, bathtubs, water heaters, refrigerators, dishwashers, sprinklers, clothes washing machines, outdoor hoses, swimming pools, boilers, stoves, ovens, gas-fired air conditioners and chillers, fireplaces, forced air and radiant heaters, as well as any other device known to those in the art. Still other types of nodes may conduct health and air quality monitoring. Nodes could monitor levels of dust, volatile organic compounds, carbon monoxide, mold, and other allergens or particles known to those in the art and report these levels to the controller. These measurement capabilities could be built into dedicated nodes or other existing node types. Some nodes may also integrate with plug-in electric and hybrid-electric vehicles (cars, scooters, Segways, etc.), or any alternative energy-powered transportation devices known to those in the art. The nodes could track charging activity and include the vehicle in analysis of home power usage or travel usage.

Networking

According to various embodiments of the invention, nodes may communicate with each other, the controller, and other devices listed herein via a low-power wireless, powerline network, or any other network system or technology known to those in the art. The network topology may be star, tree, or mesh. Example wireless network standards include ZigBee and Z-Wave. Messages are transmitted in XML, CSV, or other text or binary format. Some nodes may operate only as endpoints, while others may operate as repeaters.

Various other networks may be implemented in accordance with embodiments of the invention, including a wired or wireless local area network (LAN) and a wide area network (WAN), wireless personal area network (PAN) and other types of networks. When used in a LAN networking environment, computers and nodes may be connected to the LAN through a network interface or adapter. When used in a WAN networking environment, computers or nodes typically include a modem or other communication mechanism. Modems may be internal or external, and may be connected to the system bus via the user-input interface, or other appropriate mechanism. Computers or nodes may be connected over the Internet, an Intranet, Extranet, Ethernet, or any other system that provides communications. Some suitable communications protocols may include TCP/IP, UDP, or OSI for example. For wireless communications, communications protocols may include Bluetooth, Zigbee, IrDa or other suitable protocol. Furthermore, components of the system may communicate through a combination of wired or wireless paths.

Regarding embodiments in which wide-area networks are contemplated, such as those that allow the control of devices and retrieval of energy network information from remote devices over the Internet, various security mechanisms and measures may be taken to provide secure access to these features by authorized users. Some aspects of the invention may incorporate the use of public and private keys, PIN codes, usernames and passwords, CAPTCHA key-phrases, virtual private networking, secure tunneling technologies, SSH or HTTPS protocols, dedicated lines, other encryption methods, or any of the vast other networking security and encryption features known by those of skill in the art.

According to various embodiments and aspects of the invention, the relationship between nodes and controllers, user interfaces, computers, or other controlling devices may be characterized as a that of a client and a server. In such a structure, the server may control, monitor, or update the clients, as well as other activities known to those in the art. The benefits and characteristics of a client-server relationship will be appreciated by those in the art. Other aspects may provide for the controllers and remote access devices, such as networked computers, internet websites, remote control devices, or any other device, to be that of a server and a client. The community based servers may also act as a server where the controller may be a client. Other embodiments contemplate the reversal of these relationships. In still other embodiments, the above listed client-server relationships may instead be characterized as a distributed computing network or system. In such a structure, all nodes, controllers, remote devices, and servers may act in concert to effect processing, monitoring, and control required by the system. The benefits and characteristics of such a distributed computing network will be appreciated by those of skill in the art.

Control and Management of the Home Energy Network

According to some of the various embodiments of the present invention, the control software for the home energy network, operating within either the controller, or installed on a personal computer assigned the role of controller, automates the powering on and off (switching) of the individual nodes in the network. In various aspects, the control software and controller may further control the amount of current and voltage being allocated to each of the devices or appliances connected to any or all of the nodes in the network. Embodiments and aspects of the invention, through the implementation of these switching and control operations, may serve to conserve the electricity used by a customer's home or office while providing the user with as much convenience and control as possible.

In various aspects of the invention, the automated switching behavior of the individual nodes is determined in software with a combination of user-defined inputs and system intelligence. User-defined inputs may include an initial setup and ongoing adjustment(s) of user preferences using either the dashboard controller, personal computer, any device connected to the network (either locally or remotely), or a web interface. The types of data inputs provided by a user may include but are not limited to:

the identification, classification, and assignment of individual nodes, as well as appliances and devices connected to specific nodes;

the creation of groups and sub-groups of appliances or devices, either functional or by physical location;

the selection of lifestyle preference characteristics or other data, such data describing the general habits of users of the system, any comfort preferences of those users, and any desired goals to be reached from the use of the home energy network (such as cost savings, minimization of the environmental impact of energy consumption, or other goals);

the selection of parental control data or override passwords needed to modify system preferences, schedules, or controls;

the scheduling of certain behaviors associated to the known hours of use of nodes, groups of nodes, or the entire system by users; and any other type of input typically associated with computer systems that will be appreciated by those of skill in the art, such as profile information, personal data, display preferences (such as interface skins).

System Setup

According to some of the various embodiments, the home energy network may be set up, both initially and subsequently, in multiple different ways. In one embodiment, an interactive remote control, such as the dashboard, a wireless interface, or a software application running on a computer or other device, may activate a "setup mode" on the remote control. In various aspects, the user may then carry the remote control to each node to be configured, press a button or other selection object on the node to initiate a wireless handshake between the node and the remote control, and respond to the remote control's prompts about the location of the node and the appliance or device to be connected to the node. In other aspects, the individual nodes may be plugged into the remote control or the remote control may be plugged into the individual nodes, directly.

In another embodiment, a plug-in configuration tool may be used. Here, the plug-in tool may be plugged into each node to be configured. In some aspects, the plug-in tool may electronically handshake or otherwise connect with the connected node, and determines the type of node connected and any other node identifying information (such as version number, serial number, other universally or locally unique information, or physical orientation of the node). The plug-in tool may also optionally determine the category of device or appliance connected to the node or any other device or appliance identifying information (such as version number, serial number, or other universally or locally unique information). The plug-in tool may send received configuration information to the controller through any networking technology contained herein. In some embodiments where the plug-in tool has a display, the user can select an option on the display (e.g., select from a list of rooms or zones that the user previously defined with the dashboard) or enter new information (e.g., with a miniature keyboard). In some aspects, the plug-in tool may have been preconfigured (e.g., the user might use the dashboard to configure the tool to identify all nodes located in a certain room, plug the tool into each node in that room, then return to the dashboard to set up the next room/zone).

In other embodiments, the user may manually log or configure the nodes attached to the home energy network. In these embodiments, the nodes may have letters, numbers, names, or other codes marked on them. These identification codes or markers may be unique to a given installation but not absolutely unique; a certain installation may use a system-wide identifier code. In other aspects, these identification codes are absolutely unique. To keep track of the various nodes, a user may fill out a form, noting the identification information on each node and where the node is or will be installed. A user may then enter the form information into the dashboard, a computer, a web interface, or other configuration device.

In other embodiments, the nodes may be mapped prior to installation. As an exemplary scenario, a user may begin a guided setup process (e.g., wizard) on a dashboard interface. The setup wizard may prompt the user to select a specific node (based on type or specific node identification information) and decide where it will be installed and, optionally, what that node will be used for (which may be a specific assignment, "open outlet", or other selection). The user may then install the node. When the user returns to dashboard, the user may start the procedure over with a new node. In other variations of this procedure, multiple nodes may be simultaneously mapped and installed. In another exemplary scenario, each node may be hooked up to the dashboard, a computer, or other configuration device, whether directly or indirectly (such as through another node, a network, or an attached accessory). A user may press a button on node in order to initiate a pairing and configuration handshake with the configuring device. The user may then declare where the node will be installed and/or what will be connected, and marks the node accordingly (e.g., "living room wall" or "refrigerator"). The user repeats this procedure for all nodes to be installed.

In other embodiments, the nodes may be configured using a barcode reader. The use of the barcode reader may be similar to the plug-in installation tool, but may read barcodes on nodes instead of plugging directly into the nodes. The barcodes may be stickers affixed to nodes or printed directly on the nodes.

In other embodiments, nodes may be previously configured. This may be the case with appliances that have embedded nodes and with inline nodes, detailed herein. RFID based tags or other self-identifying technologies may also be preconfigured to work seamlessly with a home energy network.

Some embodiments contemplate the setup and integration of alternative energy sources into the system. The invention's data visualization tools (i.e., the dashboard) may provide the user with graphical and numerical data, reporting the performance of these sources and systems, or calculating the savings in energy and cost if such systems were to be installed. The graphical user interface, or any other configuration method previously described, may prompt the user with requests for information about the house (i.e., number and type of windows, roofing type, and which direction they face) to make estimates of the heat losses or loads. It may also provide forms to easily input the data such as R- and U-values generated by on-site energy audits to provide a baseline for improvements and provide quantitative tools for evaluating them. The addition of sensors such as temperature, wind, or light detectors may also be integrated to provide a richer set of data for the display and analysis on the dashboard.

In various embodiments of the invention, during the system setup process, the nodes may communicate with the user to confirm connection or registration on the network, indicate switching and monitoring status, or other node or network states. Methods of communicating with the user may include: flashing multi-colored LEDs, either alone or in an array, affixed on visible parts of the nodes or, alternatively, on parts of the node normally hidden (e.g., between the node and a wall); sounds emanating from the device in the form of beeps, clicks, tones, polyphonic sounds, or recorded or synthesized voices; or richer displays such as LED, OLED, E-Ink, LCD, or other digital display technologies.

In some related embodiments, the system or nodes may communicate automation behaviors the user. This may include the full set of LED, sounds, displays, and other indicators mentioned above (for example, a node may blink or beep when a user override event is about to time-out, or when a node is about to change switch state according to its schedule). This may also include dimming or blinking attached lamps or light fixtures. For example, if the system detects that a room is not occupied, the lights might gradually dim before switching off. This would avoid the sudden switching that occurs with many motion detector-based light switches, and would give the user a chance to react. As another example, when a user puts a home or office into "sleep" mode, the system may dim or blink an attached light fixture to confirm the user's choice.

Grouping of Devices

In various embodiments of the present invention, appliances and devices may be grouped according to function, physical location, or any other useful grouping. As an illustrative example, referring back to FIG. 3, a user might create a "media center" group 322 that includes a TV, digital video recorder (DVR), DVD player, video game console, and stereo system, that should generally all be switched on as a single unit when the media center is in use. In that example, when the media center is not in use, the group may be switched off to save power and eliminate "leak" currents. However, according to various aspects of the invention, groups may also contain "excluded devices" as described below. In some embodiments of the invention, these groupings of devices may be monitored as an entire entity instead of individually, should such functionality be desired. For example, a stereo group may have its own monitoring statistics, such a group possibly containing a receiver, CD player, and amplifier. In some aspects, the groupings may be hierarchical in nature, allowing nested levels of groupings. In those aspects, different levels of groupings would allow broader or narrower, more specific, control of devices at the desire of the user. In other embodiments of the invention, groups may be created through the use of tagging. Tags may be keywords or terms associated with or assigned to devices, thus describing the device and enabling a keyword-based grouping of the device with other devices. The tagging structure of the system may include any tagging elementes well known to those in the art, such as those described in "The Hive Mind: Folksonomies and User-Based Tagging," by Ellyssa Kroski, which is fully incorporated by reference herein. Tags may be chosen from a predefined list or added manually by a user or by the system itself. Tags may also be added to the predefined list, or to various devices automatically by the user community described herein. Aspects of the invention contemplate devices having multiple assigned tags so that the device may belong to any number of groups at the same time, and be controlled and monitored accordingly.

According to another embodiment, a user may classify certain appliances or devices as desirable for "parental control" and restrict their use by children. As a result, the system could restrict televisions, video game consoles, computers, or other entertainment devices, or any other desired device, from powering on during certain times of the day, or could limit those devices to being used for longer than a specified duration. In other aspects, the system could require a password to be input into the system, either through a mobile device, a computer, a controller or interface device, or through a keypad connected to or embedded in any node, before providing power to the device subject to parental control.

In embodiments of the invention, parents may designate appliances/devices, nodes, or groups (e.g., rooms) as "monitored" and receive notifications about when the monitored items were used and for how long. Notifications may be regular repeating reports or may only occur when time/duration limits were exceeded. For example, if a parent restricts use of a video game console to two hours per day and to times between 4 pm and 11 pm, and the child violates those rules, the parent may be notified.

To prevent children from circumventing monitoring or access controls, e.g., by moving a TV, computer, or video game console to another outlet, embodiments of the system may attempt to track the appliance/device/node. For example, if a laptop computer is unplugged from a restricted outlet node, and the system detects that one or more "new" devices has been plugged in to another outlet node (whether in the same room/zone/group or elsewhere), the system may attempt to determine whether the "new" device (or which of several) is the restricted appliance/device. This attempt may include assuming the first "new" device plugged in after the restricted device was unplugged is the restricted device, or may involve inspecting the power profiles of one or more devices and comparing against the historical power profile associated with the restricted device.

According to other aspects of the invention, an inline monitoring node, identification node, or other mobile tag or node may be attached to the restricted item in a way that makes the node or tag's removal difficult. This may include mechanically fastening a node in place using a bolt, screw, set screw, lock, or clamp, or may include gluing or bonding a node or tag in place. With the node or tag effectively locked, the restricted item may be moved between outlets without affecting the monitoring or access controls.

For ease of use, a selection of predetermined settings, groups, sub-groups, and parental controls may be available in various embodiments to provide a typical setup. In some embodiments, the system may configure initial settings based upon a self-diagnostic or assessment of the configuration of the network. There, the system may be able to determine the location and type of various nodes connected to the network, along with the identity of the devices or appliances connected through those nodes, in order to suggest or pre-configure settings, groups, sub-groups, and parental controls for the user.

Excluding Appliances and Devices

In various embodiments, certain devices may be provided power at all times and may be excluded from automated switching by the system. As an illustrative example, in the case of a media center, a digital video recorder (DVR) should be on at all times of day to ensure that the device can record scheduled programming as desired by the user. The same rules may apply to personal computers, alarm clocks, and certain other appliances and devices. Appliances and devices such as those listed above may be automatically excluded from switching once they are connected to and identified by the system. In other aspects, users can choose (via any previously mentioned or available interface, including a dashboard, a personal computer, or website) to override this behavior to include or exclude any individual appliance or device connected to the network.

Users may also be able to set varying levels of exclusion for various devices. For example, while some devices may be completely excluded from control by the system, such as the DVR described above, other devices may be controlled to an exclusion level (or point) as defined by the user. In this example, the security lighting may be dimmed down to a certain level by the system, but not turned completely off. The same could be considered for computers able to be put in a sleep or hibernation mode, but without being turned off, or other devices as will be appreciated by those of ordinary skill in the art.

Identification of Devices

Figure 16:
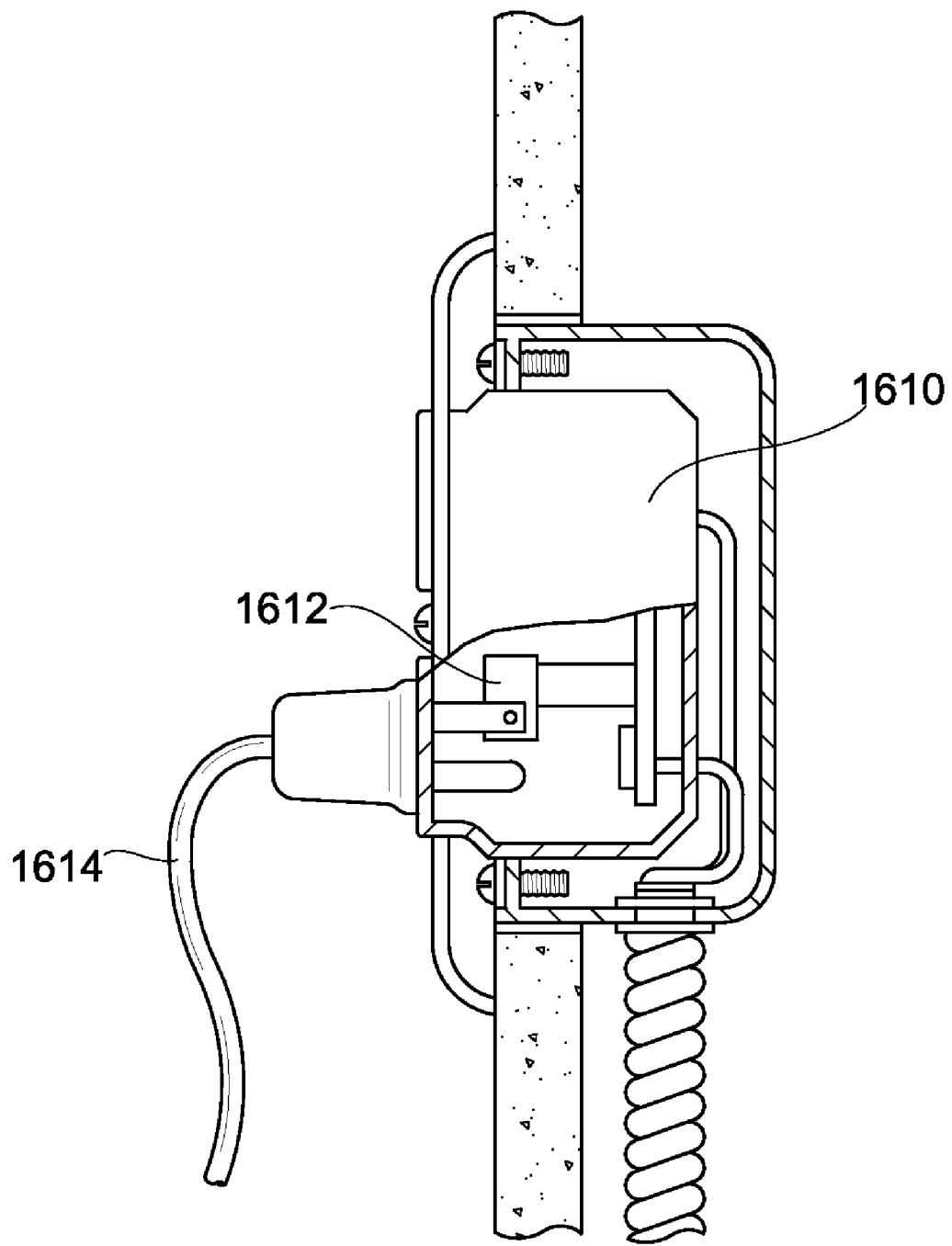

In some embodiments of the invention, when an appliance or device is plugged into an outlet node or otherwise attached to a node, the node may detect it in one or more ways. FIG. 16 is illustrative of an outlet node 1610 able to detect a plugged in device 1614 via a sensor 1612 in accordance with an embodiment of the invention. In various aspects, nodes may detect appliances or devices through numerous methods, including but not limited to any previously mentioned method or either of the following:

Via a switch triggered by the insertion of the plug into the outlet. The switch may be triggered by a cover plate that slides or pivots over the opening(s) in the receptacle, or via the blades and/or pins on the plug itself. One or more blades and/or pins may actuate a mechanical switch or an electrical contact, or may trigger an optical switch. An optical switch may involve one or more blades or pins blocking light traveling between an emitter and a receiver, or may reflect light from an emitter to a receiver.

Via a circuit detecting the presence of a new resistance or impedance on the line.

In some aspects, the node may then send a network message to the controller, or any other device connected to the network, announcing the presence of the new device. The new device may then be identified and classified in the system. In some embodiments, this identification may be entered manually by the user in response to a prompt or series of prompts from the dashboard. In other embodiments, a variety of methods are available to automatically recognizing certain devices.

According to one embodiment, an electronic handshake between the outlet node and the appliance or device may be used to recognize specific devices or appliances.

Figure 17:
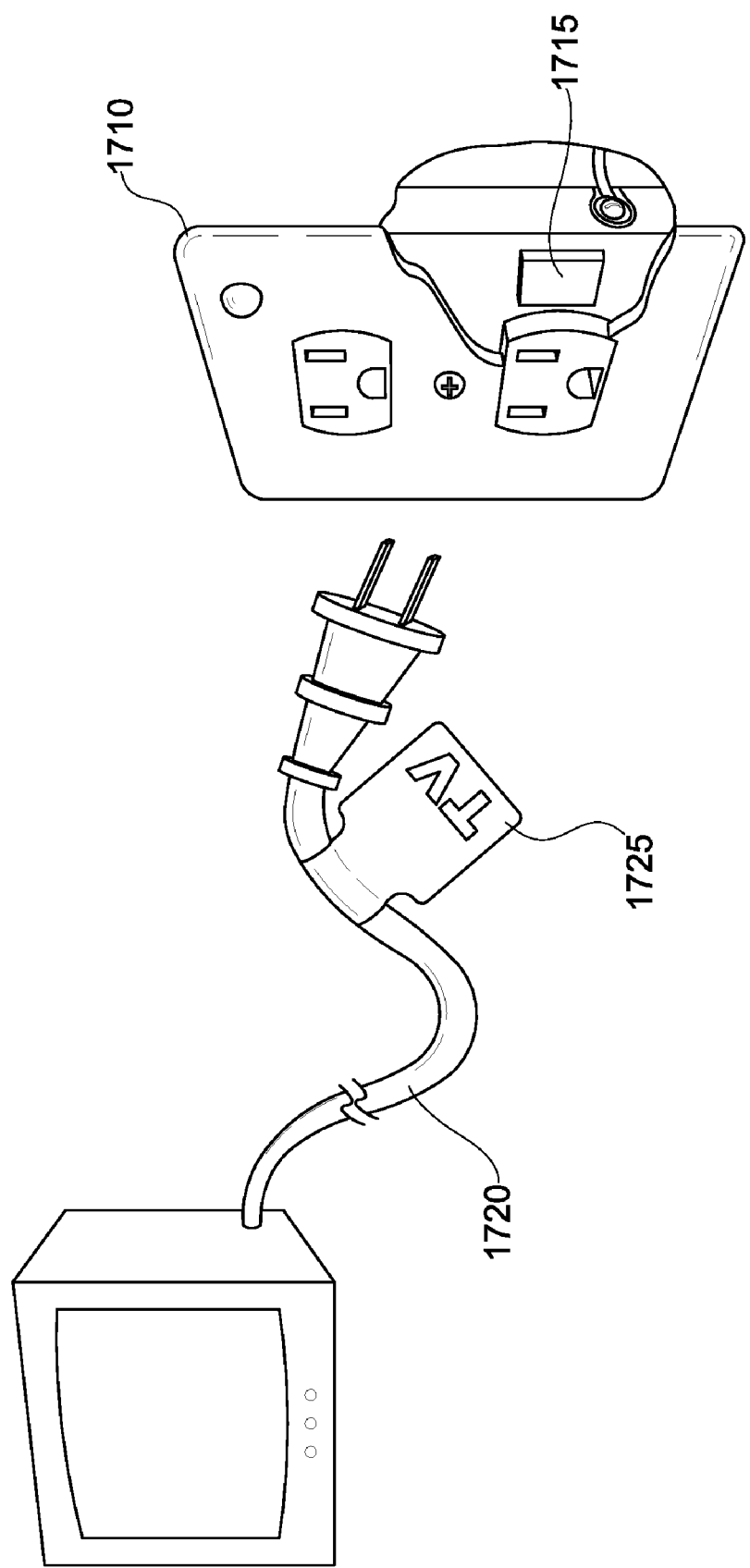

According to other embodiments, an electronic handshake between the outlet node and an additional device attached to the appliance or device, such as: an inline adapter connected between the node and appliance or device; an electronic tag, such as an RFID tag, attached to the appliance or device and read by the outlet node when the tag is within a certain range may be used to recognize specific devices or appliances. FIG. 17 is illustrative of a node capable of identifying an appliance through the use of an attached additional device, according to embodiments of the present invention. In that embodiment, an outlet node 1710 contains an RFID reader 1715. The reader is able to scan an RFID tag 1725 attached to an appliance or device's cord 1720, in order to identify the appliance or device. In various embodiments, tags may be prepackaged and pre-labeled to correspond with typical household items such as computers, air conditioners, refrigerators, lamps, washing machines, televisions, and the like, and be easily attached as stickers or twist-ties on power cords or A/C adapters.

According to yet other embodiments, the system may analyze the power consumption of the appliance or device over time to make an educated guess about its type or may be used to recognize specific devices or appliances. The system may also learn from analyzing the power signatures and consumption patterns of previously registered devices and appliances in order to better estimate the category or specific identity of newly connected appliances or devices. Further embodiments consider the system receiving updated heuristics or other identity estimation data from a remote server. In some of those embodiments, the server could create the updates based on information gathered from multiple energy network systems and from third parties, such as vendors of appliances or devices. In some aspects, the vendors may upload specific energy signature and power consumption information to the server, and through the server to the various energy network systems, in order to identify the specific model of device connected, and consequently the category and other information associated with that specific model of device or appliance. Some constituent elements of an energy signature or power consumption profile may include the amount of power consumed upon startup of the device or appliance, amount of power consumed upon normal or prolonged operation of the device or appliance, resistance of the device or appliance at both startup and during prolonged or normal usage, amount of power or resistance measured from the device or appliance during standby or other reduced power or usage modes, the times of day at which the appliance or device is typically used (e.g., a television or DVD player may be used more frequently in the afternoons or evenings, whereas a coffee maker or espresso machine is more typically used in the mornings), the frequency at which a device or appliance is used, and what other devices are typically used in conjunction with or at the same time as the device or appliance. As data describing the power profiles of specific types and models of appliances are generated both in the user's home and throughout the user community, this data can be used to improve the heuristic analysis for identifying new devices as they are connected to the system. For instance, if the system detects a pattern of high power consumption on a predictable duty cycle, the new appliance might be assumed to contain a compressor. If the appliance is attached to an outlet known to be in a bedroom, the appliance could be reasonably assumed to be a window-mounted air conditioner and not a refrigerator, and if the duty cycle or other characteristics correspond to those of a known make and model, the system could infer this as well.

In one exemplary embodiment of this process, a power consumption profile may be measured by first turning on an appliance or device. Upon startup, various characteristics of the device may be measured, such as the level of inrush of current, the current levels and durations during a startup sequence, and other current characteristics appreciated by those of skill in the art. Various inrush characteristics could include a high sharp inrush (with a high capacitance but low impedance), a high extended inrush (with a high capacitance and high impedance), a low sharp inrush (with a low capacitance but high impedance), or a low extended inrush (with a low capacitance and low impedance). Other inrush characteristics may be segmented into further, more detailed divisions and categories, and still others will be appreciated by those of skill in the art. Optionally, micro-scale power measurements may be taken, comprising calculating power factors during various operational modes of the device, calculating sinusoidal or other periodic fluctuations in current and voltage during those operational modes, and determining if the device uses a linear or switched-mode power supply. Macro-scale power measurements may also be available in the power profiling procedure, wherein the current and voltage amplitudes may be measured, the time cycling or periodic variation is current and voltage amplitudes are determined, any warm-up characteristics are discovered, or any other characteristics are discovered.

Control of Nodes

According to various embodiments of the present invention, individual nodes and groups of nodes may switch power on and off, or to varying levels, to minimize or reduce the power consumption of attached appliances and devices, exercise parental controls, enhance safety, or meet other goals of the user, while continuing to provide the ordinary service and convenience to which the user is accustomed. Various aspects may apply this ability to all types of nodes. In some embodiments, thermostats may be exempted from these switching controls, depending upon the settings of the system. Other embodiments allow other devices to be exempted based upon the requirements and environment in which the system operates. For example, a system in a restaurant may exempt the industrial refrigerator from being switched. In the various embodiments, the switching control may extend to the individual receptacle and device level. Power savings may be achieved by switching off appliances and devices when they are not in use. Embodiments of the invention contemplate switching off both "active" loads like lights and air conditioners and "inactive" loads like electronic devices that "leak" current when off or in standby mode.

Nodes may switch power on and off, or to varying levels, in response to commands from the controller. The controller may consult a schedule defined by the user, any predefined or previously configured settings (such as those described above, including automated setup), and may further adjust to or adapt to changing conditions sensed by the system. These conditions may include inputs from other nodes and sensors, such as buttons and switches, occupancy sensors, electrical activity on other nodes, or any other sensors disclosed herein.

In various aspects of the invention, nodes may also switch themselves off in response to power surges. This may be done automatically without a command from the controller if desired. In some aspects, the node may report the incident to the controller.

Control of Devices

Some embodiments of the present invention contemplate direct (and possibly two-way) communication with computers and other electronic devices, allowing the system to regulate power states and/or send commands and messages. In this way the controller could ask a computer, DVR, appliance, etc. to enter sleep mode, or low-power mode, but the device could choose how best to comply with the request, perform a number of actions before complying with the request, or choose to ignore the request. In other aspects of the invention, the controller could trigger any possible reduced-power mode of a device or appliance, such that even a slight reduction in power could be realized in that mode. This would also allow the controller to "throttle" the power draw of certain devices, with more options than a simple binary on/off, and would enable power management of devices that are not suitable for physical power switching. An illustrative example of this concept is the shutting off the heating element in an electric water heater (but not the pump).

Another embodiment contemplates the control of cooling using thermal masses, possibly in markets where electricity prices differ widely between peak and off-peak rates. When the price of electricity drops below a threshold, the controller may send a message to a chiller, air conditioner, or refrigerator. The appliance may run the compressor to cool a thermal mass (e.g., chilled liquid, ice, or eutectic salts) while electricity is cheap (and cooling demands are probably lower, assuming this is at night). When electricity prices rise and cooling demands increase, the controller may send another message to the appliance, which blows air or circulates a fluid across the cold thermal mass, providing a cooling effect without running the compressor.

The invention's automation capabilities may also be integrated with passive building systems to improve or enhance their performance. Examples of how this may work according to various embodiments include:

Controlling and/or reporting the automated opening and closing of windows and ventilation systems to regulate the timing, quantity, and flow of outside air into the home to reduce energy for heating and cooling and improve indoor air quality. This could incorporate the use of additional sensors to determine sunlight levels on the various faces of the building, outside vs. inside temperature, humidity, wind strength and direction, as well as sensors to determine indoor air-quality.

Controlling and reporting the position and angle of external sunshades and interior blinds and curtains to moderate solar heat gain, again with the potential of integrating a number of sensors.

Controlling and reporting the activity of geothermal and passive-solar thermal pumps to optimize their performance and minimize the need for other energy inputs for the heating and cooling of the building. The automation of the pumps may incorporate information about the user's schedule and activity gathered by other systems monitored by the invention. For example, water heated during the day by a passive solar system may be held in reserve in an insulated holding tank if it is known that the user will not be home for some time, and pumped only when it is needed.

Controlling and reporting on the status of gray-water collection systems.

Controlling and reporting of micro-hydroelectric generators.

Controlling and/or reporting of small wind turbines.

Scheduling

In some of the embodiments of the invention, the user may define a schedule profile based on his typical usage pattern. A schedule profile may define the switching, or other power regulating, behavior for individual appliances and devices and groups thereof. As an illustrative example, the media center in the user's living room might typically be in use on weekdays from 6:00 a.m. to 9:00 a.m., and from 3:00 p.m. to 12:00 a.m. In that example, during the remaining hours—12:00 a.m. to 6:00 a.m. and 9:00 a.m. to 3:00 p.m.—the power to the media center can be switched off, eliminating all power consumption, without inconveniencing the user. This switching may be accomplished at the wall receptacle, by disabling an entire conventional power strip, or via a group of individual receptacles in a power strip node (as well as using any of the previously mentioned node devices). In the latter case, if a digital video recorder were included in the "media center" group but also specified as excluded from automated switching, the receptacle connected to the DVR would not be switched off.

As another illustrative example, a window air conditioner in a room not typically occupied at night, such as a home office, and that is controlled via an integrated thermostat (as opposed to a central household thermostat) might be scheduled to turn off at night and turn back on in the morning, restarting early enough to cool the room before it is reoccupied.

The various contemplated embodiments do not require users to conform to a rigid schedule to enjoy the benefits of the system as the system may be designed to be temporarily disabled, at the node/group level or system-wide, to accommodate changing user behavior.

Temporary Override

In various embodiments of the invention, switching nodes may be equipped with one or more buttons or other interface elements in order to temporarily cause the entire node or part of the node to toggle or adjust state—in other words, to switch off immediately, or to behave like a normal outlet, or wall switch, or to adjust the flow of power through that outlet. In some aspects of the invention, power monitoring and communications features continue to operate during a temporary override. This feature is useful when a user wishes to override automated control, such as to activate an appliance or device for immediate use, or to immediately shut down an appliance or device normally scheduled to be on.

Figure 18:
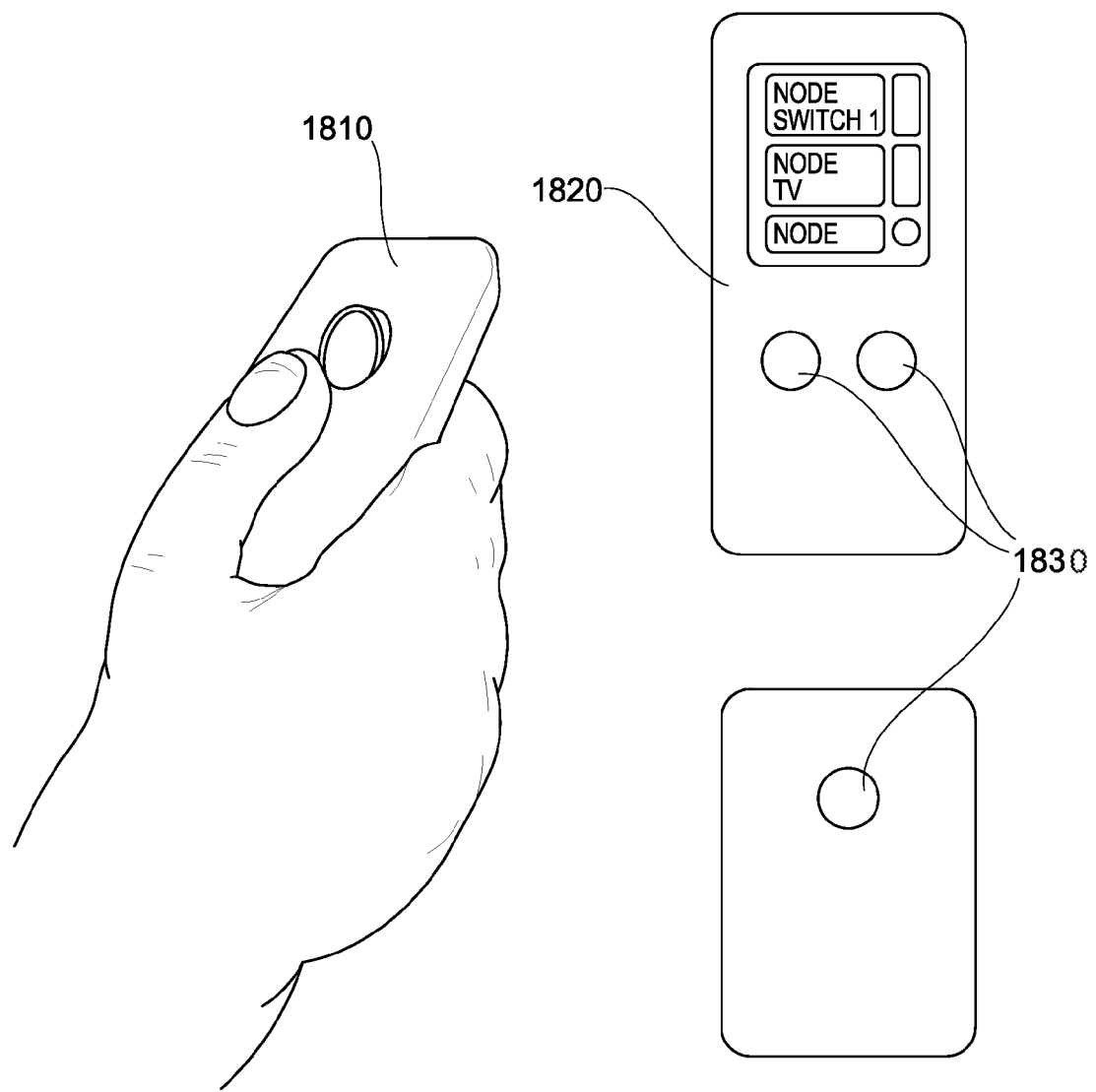
FIG. 18 shows a remote control for use in the system according to embodiments of the invention.

In other embodiments, the functionality of the node-mounted button(s) can also be duplicated via a remote control. FIG. 18 is illustrative of a remote control being used to initiate a temporary override of a node or several nodes. In various aspects, the remote control may be tethered to the node or operate via the wireless network, like remote control 1810. In other embodiments, a remote control may be programmed to operate one of several nodes via a selection screen 1820, or individual nodes like node 1830. In these embodiments, a remote control may useful for toggling the switch state of nodes that are obscured, blocked, or otherwise hard to reach.

Intelligence and Adaptation

In various embodiments, data gathered by the system may also be used by the controller, or other connected device, to improve the switching control schedule or settings without requiring direct input from the user.

According to some aspects, heuristic analysis of usage patterns may improve the energy efficiency of a specific node. As an illustrative example, once the system has established a pattern of the duty cycling of an appliance, device, or group, the system can apply that pattern to the schedule profile. In the case of appliances, devices, or groups that have pre-established schedule profiles, their schedule profile can be adjusted according to the observed usage pattern. In the case of an appliance, device, or group with no pre-established schedule profile, the system can automatically generate one and either activate it or prompt the user to activate it.

Figure 19A:
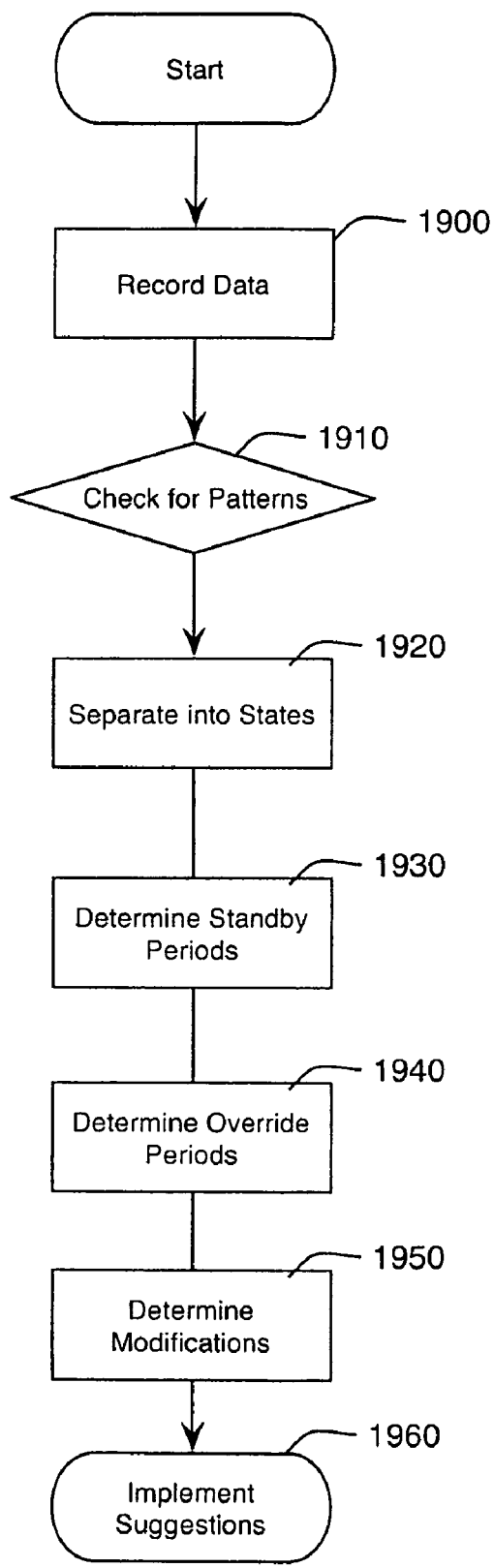
FIGS. 19a-19b show flow charts illustrating the formulation of an intelligent control policy according to embodiments of the invention.

In embodiments of the invention, the system may detect when an appliance or device is not in use, or in reduced use, and automatically switch off power, or reduce power, to that device or appliance. Other aspects may contemplate determining ideal use or lack thereof by monitoring related device use, such as the other appliances in the same room or group, or other user power-usage habits. Referring to FIG. 19a, some embodiments may accomplish this by first recording power consumption data and user override events at step 1900. The system may then determine if there are any discernible patterns in power consumption over time on the targeted node at step 1910. Here, the system may attempt to identify "modes," where instantaneous or time-averaged power consumption is predictable. At step 1920, the system then separates modes into "standby/passive" and "active" states. Some aspects of the invention may provide for the separation of multiple active states at this step. At step 1930, the system determines if the standby mode occurs at predictable time periods. In some aspects, these periods could be times of the day, certain days of the week, or other spans of time. Next, the system determines if user temporary override events occur with any predictability at step 1940. The system may then calculate optimal modifications to any existing schedules or settings at step 1950, and either implement those modifications directly or suggest implementation to the user at step 1960.

Figure 19B:
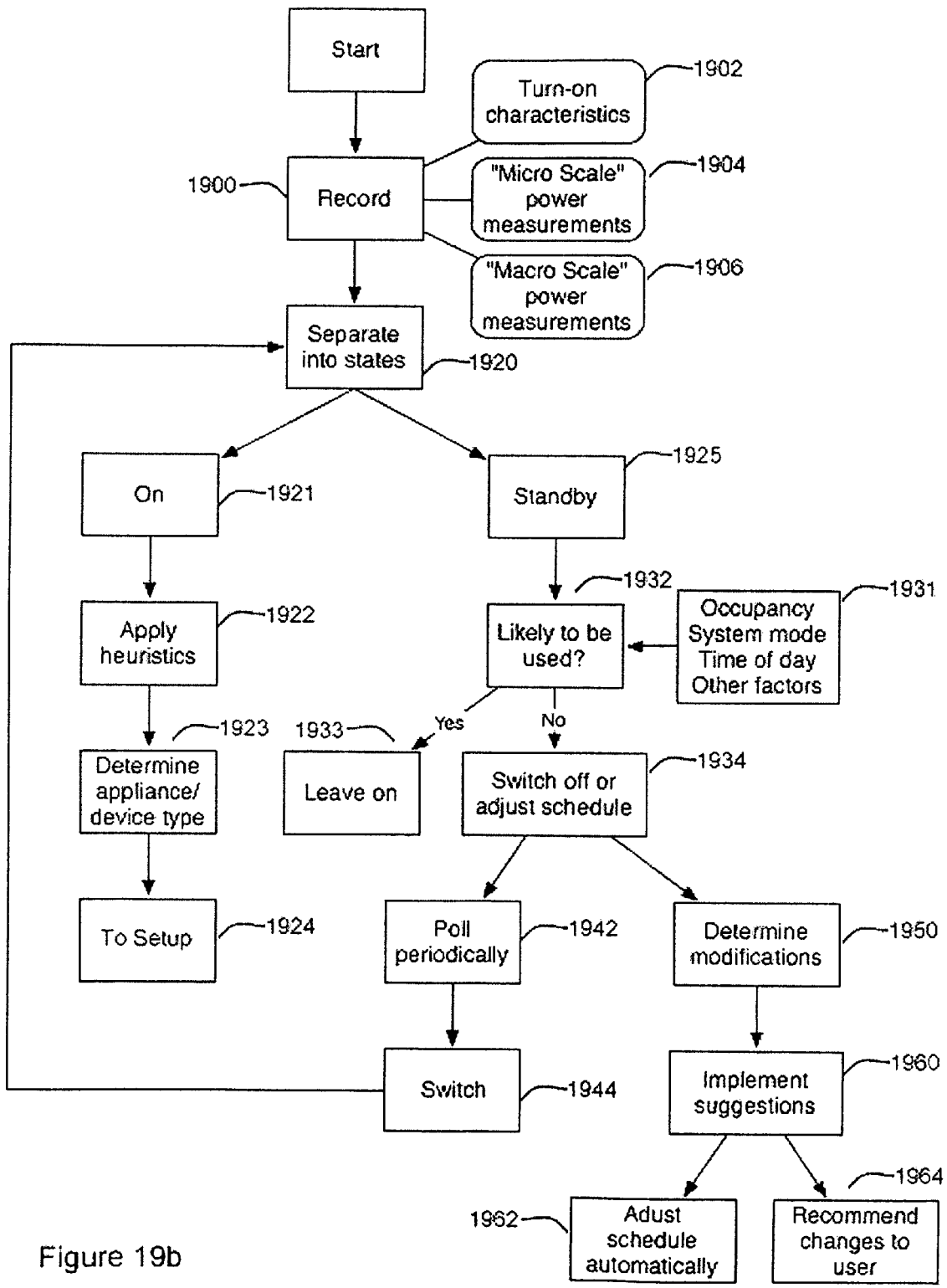

FIG. 19b illustrates another embodiment of the intelligent control policy. The system may record power consumption data at step 1900. Some of this data may include the analysis of turn-on characteristics 1902, micro-scale power measurements 1904, and macro-scale power measurements 1906. Turn-on characteristics may include inrush current levels as further described herein, such as the high sharp inrush, the high extended inrush, the low sharp inrush, or the low extended inrush profiles. These and other inrush characteristics may be analyzed by the system along with a discernable electronic boot sequence, if it occurs, in the connected power-consuming device. In some aspects of the invention, the boot sequence may be of a longer duration than the inrush characteristics, may begin after the inrush has completed, may occurs alongside the inrush characteristics, or any combination thereof. Micro-scale power measurements may be taken, comprising calculating power factors during various operational modes of the device, calculating sinusoidal or other periodic fluctuations in current and voltage during those operational modes, and determining if the device uses a linear or switched-mode power supply. These micro-scale power measurements could help determine if the connected device has an AC or DC power supply, or if the power supply is linear or switched-mode. Macro-scale power measurements may also be available in the power profiling procedure, wherein the current and voltage amplitudes may be measured, the time cycling or periodic variation is current and voltage amplitudes are determined, any warm-up characteristics are discovered, and any other characteristics are discovered. These characteristics may also be utilized in the identification of the category or specific identity of the connected device, as previously described herein.

Next, at step 1920, the system may use the recorded information in order to determine what mode the connected device is operating under, such as an active (on) state or inactive (standby) state. An off state may also exist. Based on this determination, the policy then either moves to step 1921 for active devices, or to step 1925 for inactive devices. At 1922, if active, the system may apply heuristics analysis to the recorded data, such as determining what type of power source, boot sequence, or other characteristics the connected device exhibits. Based on these heuristic analyses, the category or specific identity of the connected appliance or device is determined at step 1923. Step 1924 then sends the device category or identity, as identifying information, to the setup process further detailed herein. The system may then periodically poll the connected device or node to determine if a state change occurs and continually monitor and improve the intelligent control policy.

If the connected device is in an inactive state, step 1932 determines if the device is likely to be used within a set amount of time using information already known in the policy at 1931, such as occupancy of the home or business, the mode or configuration profile currently in effect in the energy network, the time of day, or any other factors involved in the intelligent policy. The set amount of time may be any amount of time, such as a minute, five minute interval, quarter or half-hour intervals, or multiples of hours. If the device is likely to be used, the device is left on in the inactive state at 1933. If, on the other hand, the device is not likely to be used, step 1934 may switch off power to the device or adjust the device's schedule in the energy network. Step 1934 may also further reduce the amount of power consumed by the device, or further control the device using any of the methods described herein. After being switched off, the connected device may be periodically polled at 1942 in order to determine if a state change occurs and continually monitor and improve the intelligent control policy. The system may also determine optimal modifications to any existing schedules or settings at step 1950, and either implement those modifications at step 1960. Implementation may occur as either a direct or automatic adjustment to the schedule at 1962, or by recommending changes to the user at 1964.

At step 1942, the system may periodically poll the connected device, directly or through a node, to determine if a state change at the device has occurred. If a device's state has switched, like at step 1944, the system may again determine the current state of the connected device at 1920. This way, the system may continue to improve, modify itself, and adapt according to the usage habits recognized by the intelligent control policy.

In various embodiments of the invention, the system may use an attached battery in order to provide a buffer for balancing electricity generation and storage with the electricity usage determined from the monitoring nodes. In some of these embodiments, the automated decoupling of instantaneous generation from instantaneous consumption will provide additional benefits to users. When attached to a battery storage system, the energy automation system may be able to regulate flexible usage (i.e., electricity draws that can be shifted in time, or that are optional) such that, when taking the base (i.e., fixed) load into account, the overall load stays entirely within available stored power reserves or within a certain excess of stored reserves.

In some of these embodiments, the dashboard may provide visualizations of the flow of electricity through a battery system (like a Prius), the grid, other sources, and various loads in the home/office. The dashboard may provide visualizations of the batteries' level of charge over time. The system may provide visualizations/projections about the past, present, and future balance between battery draw, grid draw, and generation. For example, in the middle of a sunny summer day, a visualization might show electricity inputs from solar panels and the battery system, with the power flowing to a variety of loads. The visualization may show that the photovoltaic system's output is near its peak and meets the draw of the air conditioning system (and may allow for charging of the batteries). As the sun drops lower in the sky, or is obscured by clouds, the visualization may change to show that the batteries are depleted and additional power is needed from the grid to meet the air conditioning and other loads. Embodiments of the system also contemplate the system may deciding to draw from reserves based on factors such as the price of electricity or when service interruptions are imminent. Other consider the system deciding to store energy within the battery system based on factors such as the price of electricity, loads on the power grid, and availability of various modes of generation (i.e., solar, wind, etc.). In other words, if electricity is more expensive during the day, it may make economic sense to charge the batteries from the grid at night. The potential money savings may not be sufficient to justify the installation of batteries alone, but in a building already equipped with onsite solar/wind/whatever generation and batteries, charging from the grid at night may be worthwhile. Embodiments of the system may maintain a minimum battery level for use in emergency situations. In such situations, the system might apply an "emergency" configuration profile, shutting off all appliances and devices (potentially including those normally excluded from switching) not necessary for safety and security.

Similarly, the use of diesel and gasoline generators may also be monitored and controlled. If the system determines, by reasons of cost, efficiency, or load, the generator is a preferable source of electricity for the building, the system may automatically switch from other sources of power to the generator.

Predictable Behavior

As noted above and as contemplated by various embodiments, if the standby mode is predicable, the system may automatically schedule the appliance, device, or group to switch off when the device is likely to be in standby. If a schedule already exists, the system may modify it. According to some aspects, scheduling may be based on statistical likelihood—for example, switching the device off during the time interval defined by a number of standard deviations of observations where the device was in the standby mode. Some aspects may test predictions by periodically modifying the various device schedules and power/configuration profiles and determining if more or less overrides occur as a result. If less overrides occur, the system may further modify the schedules and profiles. If more overrides occur, the system may revert to a prior schedule or profile.

Additionally, if user override events are predictable, the system may modify the schedule for an appliance, device, or group to comport with the predicted override. This may be done with the intention of providing greater convenience to the user. The schedule adjustment may occur automatically or the user may be prompted to approve or modify the modification. Modifications may be determined statistically, as above, or otherwise. The system may also use prompts to advise users on opportunities to adjust their behavior to better conserve energy.

Unpredictable Behavior

To accommodate unpredictable use of appliances, devices, or groups, embodiments of the invention may also automatically switch off, or reduce, power to an appliance, device, or group that has been in standby mode for a certain length of time. In this case, the node(s) may remain switched off until commanded to switch on (by the controller, based on automatic behavior or user command, or by a user through the temporary override button(s) on the node) or may periodically switch on to check the state of the connected appliance or device. In the latter case, the system may switch the power on and wait long enough to ensure that the appliance or device has reached a steady state.

As an illustrative example, a battery charger may be switched off while unused. In that example, when a user connects a battery or battery-powered device to the charger, the user may push the override button to reactivate the charger. Alternatively, if the node is periodically switched on to check the state of the charger, the charger will begin charging and system will detect that the power consumption is greater than in standby mode, and the node will leave the power switched on. In either case, when the battery is charged and the charger enters standby mode, the node may automatically switch power off.

External Influences

Aspects of the invention may also make use of data gathered outside of the system, including data aggregated by systems of other home energy network users and conditions related to the power grid such as the real-time cost of electricity and the total load on the grid. This information may be used to advise users on the least expensive time to use certain appliances or devices, or to warn users of grid conditions that could lead to power service interruptions.

Zone Control

In various embodiments of the invention, appliances and devices can be grouped by function, physical location, or other useful grouping. Groups may also be nested. For example, a home office may include a "computer" group comprised of a personal computer, a monitor, and several peripheral devices. The "computer" group may be included within a "desk" group that also includes a desk lamp and stereo system. The "home office" group would then include the "desk" group (and nested "computer" group) plus all other appliances and devices in the room.

Figure 20:
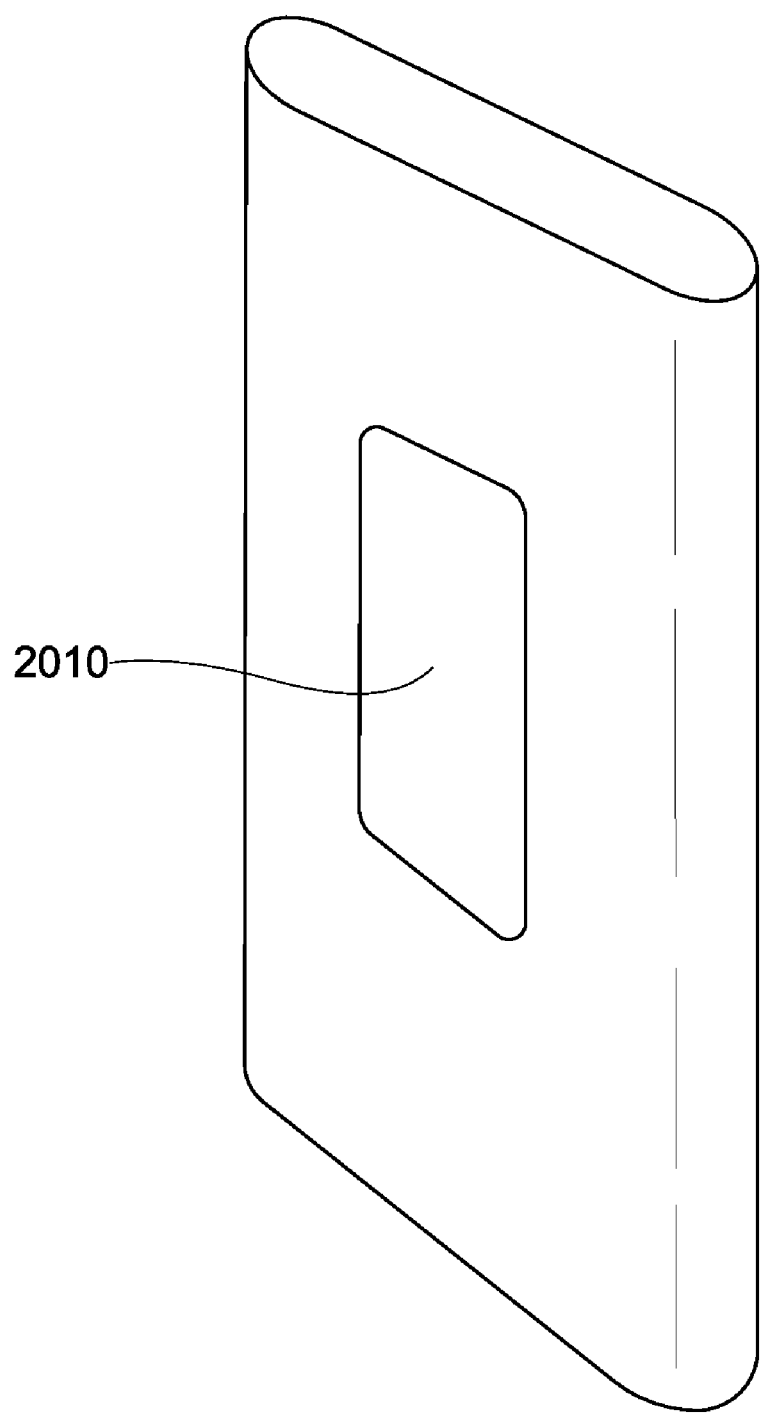
FIG. 20 shows a control node according to embodiments of the invention.

Some aspects of the invention consider that it may be desirable for a user to simultaneously activate or disable all appliances and devices in a zone. FIG. 20 is illustrative of a control node with a single button or switch 2010 assigned to the task of activating or disabling a zone (which may be duplicated in other locations, with other nodes, to achieve the same purpose). In that embodiment, the control node may be connected to the network similarly to any other node on the network. Other embodiments allow zones to be activated or disabled by being selected from a list of options on a display, such as a dashboard, remote control, computer, mobile device, or other interface. In the home office example, when a user enters the room, a button or switch located on the wall (adjacent to or replacing a typical light switch) may send a command to the controller to toggle the state of the entire zone.

In other various embodiments, occupancy sensors, including but not limited to motion detectors, door position switches, and optical triggers, may also alert the system to the presence of a user in a particular zone. Similarly, if the system detects that a user is interacting with a certain appliance or device, the system may use that information to activate other appliances, devices, groups, or zones.

Embodiments of the present invention contemplate the zone concept being extended to system-wide configuration profiles. Commands in these configuration profiles may trickle down through the hierarchy or tags of groups until it gets to specific devices. Profiles, also called "modes," might include "sleep," "housekeeper," "normal," "bedtime," or other modes. One such configuration profile may function as a "sleep button" for an entire home or office. In this way, the entire system may enter its maximum power-saving mode by pressing a single button or switch. The opposite—disabling all power-saving functions on all nodes—may also useful, for example when a contractor or cleaning staff is working in the home or office. According to various aspects, this sleep function may be enabled through any controller, computer, mobile device, web site, or any other device connected to the network.

Embodiments of the present invention also contemplate personalized comfort zones that follow certain individuals. If the HVAC system were so equipped, each room or zone could be maintained at the temperature and/or humidity preferred by each individual. In some aspects, comfort zones may also be extended to lighting. For example, some individuals might prefer overhead lights in certain rooms, while others might prefer task lamps. In some embodiments, the system may follow individuals from zone to zone via biometrics, manual tracking (i.e., people use keypads to indicate when they move to a new zone), or electronic tracking, and control the HVAC/lighting system to follow their preferences. in a way that follows the individuals.

Aspects of the invention allow users a choice between maintaining optimal comfort (i.e., normal operation) and minimizing energy use in comfort zones and generally throughout the system. For example, a user might select a maximum energy or cost expenditure per day, week, or month, and let the system automatically adjust its settings to compensate. As the primary method, the system will most likely adjust thermostat settings and/or enable/disable climate control subsystems.

In other embodiments, the zone control system can be configured to comport with religious requirements. In an illustrative example, the automation features may find use with Jewish users who observe the Sabbath and maintain Kosher households. Respecting the Kosher rules of "direct" and "indirect" action may be achieved by adding time delays and some limited random behaviors to various specialized zones of the system but may still allow for the powering on and off or other modifications to appliances, devices, and heating and cooling systems.

Data Reporting, Auditing, and Analysis

Local Dashboard

In some of the various embodiments, the local dashboard, whether hosted on dedicated hardware or as software installed on a personal computer, or whether hosted on another interface such as a mobile device or website, may aggregate stored and real-time data to provide a variety of data visualizations to the user via a graphical interface. In various aspects, these visualizations may include:

Power draw of individual appliances and devices, of groups of appliances and devices, of an entire home/office, or by individual person (based on user-defined occupancy level or sensed occupancy level).

Power generated from sources other than the grid (fuel-burning generators, photovoltaic or other solar, hydroelectric, wind, geothermal).

Percentage of home/office being monitored by total consumption or by number of appliances or devices, or by installed wiring circuits. In the case of total consumption, the total household/office power load, as measured at the main electrical feed to the breaker box, is subtracted from the sum of all power being monitored by individual nodes. The remaining power load may be considered "unmonitored".

Usage patterns of individual appliances and devices, of groups of appliances and devices, or of system features. Examples of usage pattern data include how often automation features are temporarily disabled using buttons on nodes, individual appliances/devices or groups are turned on and off (for example, how often the lights are turned on/off in the master bedroom), appliances and devices are used or become active based on observation of their power profiles (for example: a thermostat may be monitored for when it calls for heating/cooling from the HVAC system, air conditioners and refrigerators may be monitored for when their compressors and fans switch on, and personal computers may be monitored for when they switch between "on", "standby/sleep", and "off".)

In various embodiments of the invention, the dashboard or controller (or other device) may monitor and present information regarding the power usage of the home energy network. In one aspect, the dashboard or system may establish a baseline power consumption before implementation of the home energy network. This can be done either by manually entering utility bills or other consumption information for a period ending prior to the installation of the network, or by the system passively monitoring power usage before implementing scheduling or other control features of the network. In other aspects, the system could gather historical data from third party systems such as the power company. After establishing a baseline, the dashboard can present a cost-savings or cost-benefit analysis to the user, showing in part the improvements and efficiencies realized by the home energy network.

In some embodiments, the dashboard or controller could also track data, entered by the user or received over the internet, about travel (auto, air, train, etc.) habits and how they contribute to users' footprints. In this way, the system becomes a sort of hub for the user's carbon footprint and other environmental factors. The system might also record quantity and type of garbage and recycled waste.

In still other aspects, the dashboard or controller may track non-energy usage activities and properties of the home or business in which the dashboard or controller operates. For example, if a user adds new insulation to a home running the home energy network, that user may be able to input the type, size, location, R-value, brand, and other identifying data, into the dashboard or controller for use in calculation and analysis activities of the dashboard or controller. Other aspects contemplate the addition of carpeting, windows, doors, and other non-energy usage additions to the home. The controller or dashboard may then calculate energy leaks using this information, in the form of wasted energy for heating, cooling, or other activities.

Various aspects and embodiments of the invention contemplate controllers, such as those described above, that contain ports, processors, switches, or memory modules. Ports may be any type of device, communications bus, network connection, or other device that allows or provides communication from the controller to any other component or device, whether in the described invention or beyond. Processors may consist of circuitry, conventional processors, registers, calculators, algorithms, subroutines, or any other method of analyzing or manipulating data. Switches may be any of the types of switches described herein, such as a circuit to enable or disable the flow of power. Memory modules may consist of any type of memory device, such as random-access memory, read-only memory, flash memory chips, processor registers, caches, hard disks, readable or writable optical or tape storage, capacitors, other circuitry, or any other type of device known to those of skill in the art.

Display of Information

In various embodiments of the present invention, data can be displayed in real-time or historically. Historical data may be displayed by hour, day, week, month, year, or any user-defined interval. Intervals may be chosen via selections in the graphical user interface, or input directly.

Figure 21:
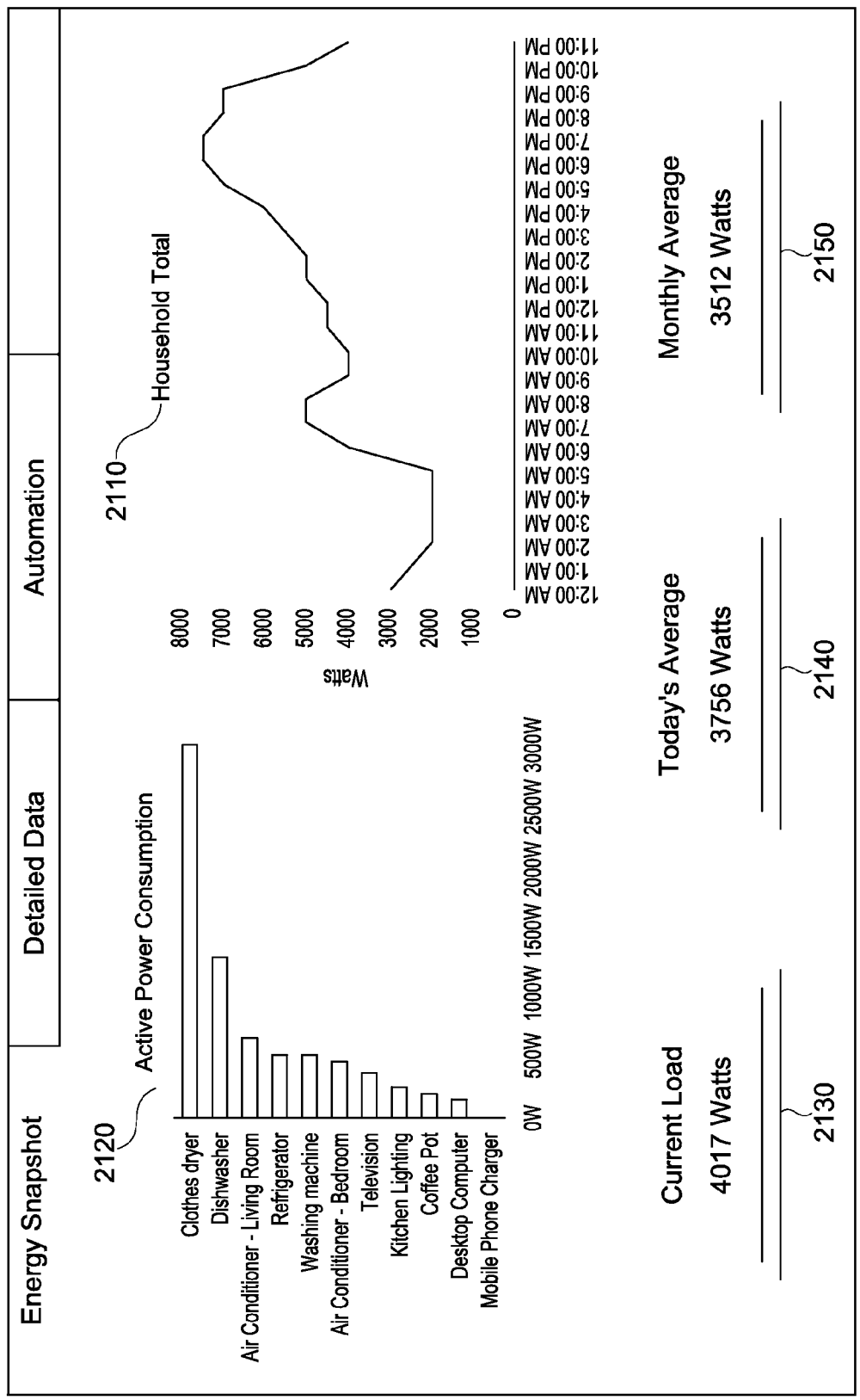
FIG. 21 shows an illustrative display according to embodiments of the invention.

FIG. 21 is illustrative of a display according to one of the embodiments of the invention. Real-time data may be displayed in the form of a current load 2130. Historical data may be displayed in the form of a daily average 2140 or monthly average 2150. Historical data may also be displayed in the form of a bar graph showing power use over time as in graph 2110. Data may be displayed as numeric text, as graphs and charts, or via custom graphical representations. Data may also be converted from native units in the direct measurements (voltage, current, power, power and factor) to derived units. For instance, power data might be displayed in terms of the quantity of fuel used to generate the energy, or the emissions released while generating the energy. In these examples, conversion values published by the government, regulatory agencies, utilities companies, and other reputable sources may be used. In some embodiments, custom graphical representations may include representations of derived units (piles of coal that increase in size as power in consumed, windmills that spin faster in proportion to rate of consumption) and analogies to other physical systems (pipes, rivers, etc.), or any other graphical representation appreciated by those of skill in the art.

In other aspects, data may also be filtered and sorted to display the largest, smallest, and average power draws by group or individual appliance/device, as illustrated in graph 2120.

In some of the embodiments, data presented on the local dashboard may be confined to data gathered by the system on the user's premises. However, other embodiments may use other data sources, including data entered manually by the user (for example, to obtain historical data predating the installation of the system, or data gathered by other data acquisition systems not integrated with this system). Data received from the internet, such as regional averages gathered from other customers, may also be included.

Based on observed usage patterns, embodiments of the invention may identify opportunities for users to adjust their behavior to save energy. This may include observations of wasteful or inefficient use of appliances, devices, or groups, and opportunities to change the timing and duration of certain behaviors. These opportunities may be identified based on external data, such as energy prices or observed behaviors of other users. The system may prompt users to approve or modify suggested automation scheduling changes, or may inform users of changes that were automatically applied.

In various embodiments of the invention, the dashboard may present a visualization of energy consumption, from one or multiple sources of energy, over time. The visualization may include the price of electricity ($/kWh) over time for each of the various sources of energy, whether the pricing is based on a fixed peak/off-peak schedule, or realtime pricing data gathered over the Internet, cellular networks, or other communication networks. The display may also include the system's electricity usage (kW) over time, as well as a dollars per time period calculation based upon multiplying the price by usage, which can be done on a system-wide average or individual energy source basis. Further aspects of the invention contemplate the visualization of the generation of alternate sources of energy over time (such as a typical solar curve during daylight, with various random dips from clouds or other obstructions and systematic shifts from seasonal or weather based effects). In these aspects, the power generated by these alternate, or possibly free, sources of energy may be subtracted from the overall usage of the system in order to visualize the "effective" price of electricity and to show how alternative energy generation plays into the cost of operating a building or other energy network. These aspects and embodiments can present the ability for users to see opportunities to shift their usage patterns throughout the day to better align with the inputs from alternate sources of energy. The dashboard may also offer suggestions for automatically shifting consumption to align with alternate inputs, for example by scheduling a certain appliance or device to run when the wind or solar system is producing excess power, or by adjusting lighting levels based on the intensity of solar power being generated (such as dimming internal lights when solar output is high).

Various aspects and embodiments of the invention contemplate user interface devices, such as those described above, that contain ports, processors, switches, or memory modules. Ports may be any type of device, communications bus, network connection, or other device that allows or provides communication from the user interface device to any other component or device, whether in the described invention or beyond. Processors may consist of circuitry, conventional processors, registers, calculators, algorithms, subroutines, or any other method of analyzing or manipulating data. Switches may be any of the types of switches described herein, such as a circuit to enable or disable the flow of power. Memory modules may consist of any type of memory device, such as random-access memory, read-only memory, flash memory chips, processor registers, caches, hard disks, readable or writable optical or tape storage, capacitors, other circuitry, or any other type of device known to those of skill in the art.

Mobile Interaction with System

Various embodiments contemplate users interacting with the system from mobile devices. Many of these mobile interaction methods are those appreciated by those of skill in the art. Some example communication options include:

phone call or text message (SMS) to the system on the user's premises (if system is equipped with a land line, cellular connection, or VOIP phone system);

phone call to an automated call center (in this case, the call center may automatically identify the user via their telephone number);

text message (SMS) to automated call center or SMS short code (in this case, the server may automatically identify the user via their telephone number);

web browser application on a mobile device, such as a cell phone or PDA;

other application running on a JAVA, BREW, or other platform on a mobile device; and dedicated remote control device equipped with mobile communication capability (such as cellular, WiFi, WiMax).

Users may use mobile communication with the system to monitor or remotely control the system using all or a subset of the functions available via the dashboard or website, or to notify the system of changes in the user's schedule.

In some aspects of the invention, monitoring and remotely controlling the system may include switching appliances and devices on and off; adjusting climate control systems; receiving reports on the status and power consumption of appliances and devices, customized for the mobile device; receiving messages from utility companies about the price of electricity, service interruptions, or the condition of or load on the electric grid; or parental controls.

As an example of a user notifying the system of changes in his schedule, the user may decide to return to the home or office early, or may decide to lengthen his time away. The system would use this information to adjust the schedule profile for a variety of appliances and devices and groups thereof. For example, the system may adjust the thermostat, activate window air conditioners, and adjust lighting in anticipation of the user's return.

Online Communication Between Controller and the Internet

In various embodiments of the present invention, a controller may use the local home/office network, or any of the other networking technologies mentioned herein, to connect to the Internet. Connection to the local network may be through a network hub/switch/router via wireless (e.g., IEEE 802.11, 802.16, or future standards), ethernet, A/C electrical wiring, or other dedicated wiring. The controller may automatically find an open wireless network. Network configuration settings may be controlled via the local dashboard.

According to various embodiments of the invention, the controller sends ("pushes") recorded data to a server on the Internet. This may occur at automatic intervals or when a user commands a transmission to be made. This data may be raw data, as collected from the nodes, or data that has been processed or filtered into a format readable by the server on the Internet, such as the XML format. The controller may also transmit information about its configuration so that online services can mirror the customized interface that the user is accustomed to.

In various embodiments, the controller may be capable of responding to incoming communication ("pulls") from the Internet and communicating the same data as above in that response. Incoming messages may include requests for updated data, remote control commands, additional data, software upgrades, or messages to the user.

In some aspects, messages to the user may include messages from the local utility company. Users who have chosen to receive such messages may, for example, receive a notification of a service interruption, or a request for a particular action (such as a request to reduce consumption based on warnings that the power grid is excessively stressed), or a change in energy pricing.

As previously described, above, the remote access and control methods of the present invention may be implemented with any security or encryption methods or technologies known or appreciated by those of skill in the art.

Online Analytical Tools

Some embodiments of the present invention contemplate the use of online analytical tools. These tools may be provided via a website hosted on an internet server. One such tool may be the duplication of the data visualization and analysis capabilities of the local dashboard, including the specific configuration and look/feel of the user's own dashboard. Another tool may be comparison of one customer's data to many others via aggregated/mined data such as local (community) averages, regional averages, and national averages.

The online tools can be applied to the same metrics and visualizations listed above for the dashboard interface. For example, a customer might compare the power consumption of their television with the national average for televisions or the power consumption of their air conditioner with other customers within a certain radius and with similar homes/offices.

Some embodiments allow the user to improve comparisons by defining additional aspects of their system. For example, the user might choose the specific make and model of their television, letting the system know it is a 37-inch LCD. Alternatively, the user might describe their home as a 1000-sq. ft. 2-bedroom apartment in a brick building, or as a 3000-sq. ft. freestanding wood-frame house.

Embodiments of the invention provide online analytical tools that can also be used to identify trends such as changes in average power consumption at regional and national levels, changes in customer behavior at regional and national levels, and typical benefits achieved by users who install energy efficiency enhancing products in their homes/offices.

The online analytical tools may also be used to model or project the impact of certain changes on a user's energy consumption. For example, using data acquired about a customer's air conditioner, such as temperature set point, duty cycle, power consumption, brand, and model, a tool can calculate the potential savings associated with replacing the unit with another specific model. Similar calculations may be used in combination with aggregated data from other customers to model or project the effects of equipment substitution (replace X appliance with similar, but more efficient, Y), equipment type substitution (replace window air conditioner with central), improvement to a related system (i.e., new windows and projected improvements in A/C usage), changes in habits (e.g., raising or lowering the temperature set point on a thermostat), or scheduling and automation (e.g., shutting down an appliance/device or group).

Data Sharing and Community Features

According to some embodiments, analytical tools, offered to users in the context of an online community or forum, may allow users to share data and advice and to participate in motivational tools. One such tool contemplated by the various embodiments includes hosted user forums to allow for person-to-person communication and posting of data reports for direct comparison to the individual and aggregated data of other users. Another embodiment consists of individual profile pages for users to share customized information about their home energy usage and themselves; including statistics, blog entries, articles, links, and custom applications. Yet another aspect includes software tools and scriptable "widgets" that are generated by both the company and the community of users and shared online. These custom applications can make use of system-generated data or data relevant to the use of the system. They can be embedded in user forums and other pages, embedded in third-party websites (including other social networking sites) or can be installed on the user's personal computer or other web-enabled devices.

The company-hosted website may also provide content to encourage ongoing participation by the users and the community and to motivate individuals to reduce their "energy footprint". Strategies for accomplishing this may include company-hosted and community-generated online events, such as "an hour without power", "a day without a/c", home-improvement challenges, and other events. Tools to set, track, and reward goals may also be utilized. These goals could be both for the individual and shared with the community, or collective goals that encourage the participation of a group of users. Rewards for energy-conservation results could include announcements of results to the community or discounts and coupons for sponsored products or service providers. Other aspects consider the use of challenges and games as motivators. Challenges can be made between individuals and between groups to bring an element of competition and sport to energy usage. Milestones and goals may also be incorporated into the website. These milestones and goals can be for both individuals and groups and represent a variety of metrics.

In some embodiments, the website may include both user-generated content (i.e., forums and reviews) and individual system-generated data (i.e., energy usage profiles for certain devices and appliances), as well as content provided by the company (i.e., analysis tools and control interfaces for the clients' systems). Each of these content types provides opportunities to create data valuable to the client, the primary company, and third-party companies. Each may also be represented with unique webpages where users may spend time online participating in activities relating to their energy usage and power-consuming appliances/devices. The user-generated content, system generated data, and the website itself may provide a number of business opportunities.

As an illustrative example, a user can perform an in-depth energy audit to compare their recorded power consumption with that of similar users in similar homes. The user might be informed that one or more of their appliances is inefficient and be offered a more efficient substitute from a sponsored vendor: "Based on our analysis of your data, if you replaced your air conditioner with ABC sponsored product, you will save $XYZ per year."

As another illustrative example, data collected from individual users could be sent verbatim, or could be processed/filtered, or could be aggregated with data from other users, and sold to appliance manufacturers, utility companies, etc. who might want to analyze usage patterns.

As another illustrative example, users can post online product reviews, but unlike traditional "soft" reviews (where the content is typically qualitative), users can also add quantitative data. For example, the website may allow users to access and post their own data to "prove" the performance of an appliance or device, or to support or verify observations. As a result, users could communicate that a particular model of refrigerator is both better looking (qualitative) and more energy efficient than a comparable unit.

As an illustrative extension of the above example, the widgets that all users use to post data in product reviews, articles, and forum posts may be posted to other websites. For example, a user might embed the widget in a review on Amazon.com, in which case the widget would likely be served directly by the website with a tag like "Powered by EnergyHub" (similar to the way embedded online maps often include tags from Google or Mapquest).

As another illustrative example, while browsing web pages or shopping online, users may be offered contextual advertising (or feature products) that employs the individual user's energy usage data to provide specific product pitches. For example, while a user is reading a product description, forum message, or article containing references to a type of appliance or device, an advertisement for that type of appliance/device might be presented along with an estimate or projection of the potential energy savings that the user could realize with the advertised product. ("Install the [sponsored product] and save x % per year", where x % is calculated by comparing the energy use of the sponsored product with the recorded energy use of the user's current product.)

As another illustrative example, energy saving challenges could be offered with rewards by utility companies or other sponsors. For example, if a given consumer can demonstrate a reduction of x % in their energy use as compared to their previous use or the use of another user or group of users, then the user might receive a discount on a future purchase or a rebate on their utility bill.

As another illustrative example, a vendor may give customers a discount (up to 100%) on the system hardware in exchange for a portion (up to 100%) of the savings realized using the system over a certain time. Other distributors or partners (e.g., a utility company) might subsidize the cost of the system for their customers for the same reason.

As another illustrative example, to maximize the value of the data received from customers' systems, users may enter detailed information about the appliances and devices connected to their systems, and the configurations of their systems. This may include make and model, physical location, and other details. Many details may need to be entered manually. To encourage users to enter as much information as possible, users may be offered incentives. These incentives may be online via a website or may be offered through a personal computer or local dashboard. Incentives may be in the form of: entries into contests or games, discounts, credits, or other offers from partner companies (especially utility companies or appliance/device manufacturers).

As another illustrative example, the dashboard (or other element of the system) might inform the user that only X % of their home/office is currently being monitored/controlled, and that they're saving Y % as a result.

As another illustrative example, the system might inform the user that their consumption is higher than comparable other users, and offer a remote energy audit (e.g., on the website) or an on-premises energy audit (probably involving sending a third-party person to do the audit, which could generate a referral fee or an ongoing fee calculated as a percentage of the savings resulting from the audit).

As another illustrative example, users who opt in to receive advertising and product offerings could have a portion of their utility bill subsidized by the advertiser.

As another illustrative example, someone may log in to a web forum and says "I just got a quote from a contractor to install new low-e windows. He says they're energy efficient and will save me money—is this true, and if so, how much more efficient are they?" Another user replies and says "Look at the attached widget—when I had low-e windows installed, my summer air conditioning load dropped by A % or B kWh/day [or other time period]. I save an average of $C per month, which means the windows paid for themselves in D months/years."

As another illustrative example, users can create personal profiles that include aspects of their personal energy use, including detailed graphs and numerical summaries. Users can also select "preferred products" and post data supporting their preferences. This functions similarly to posting data in product reviews as described above.

The effectiveness of these online initiatives may, in part, be determined by the metrics used and how these metrics are presented. The entire suite of analytic tools available to the user, under some embodiments, may make use of the data in a host of ways, but for the purposes of the community-driven aspects of the system, the simplest-to-read and most fundamental metrics may be preferable. These may include absolute data, such as amount of electricity used and the estimated carbon dioxide that represents, or relative data, like how much improvement has been seen over time for a given user or group.

Having described a number of different embodiments of the invention, it should be apparent to the person of ordinary skill that the invention has numerous benefits and advantages. For example, the invention provides a systemized framework for monitoring and controlling the vast amount of power consuming and providing devices in a business or home.

The ability to compare energy savings and conservation with the energy savings and conservation of other users in a community not only encourages the efficient management of resources, but also allows for previously unprecedented experimentation and information dissemination amongst a large group of consumers.

Further, the ability to monitor mobile devices as they move around a household or business allows more precise calculations as to the true power consumption profile of the various devices connected to the monitoring system. Improved power consumption profiles then, in turn, allow users to drastically improve energy consuming behaviors and habits in order gain increased energy efficiency.

The invention provides particular benefits consumers in that it provides a user-centric system for managing, monitoring, and understanding energy usage. This level of user centricity has never before been contemplated.

Because the invention allows users to more efficiently monitor and manage their consumption of energy in homes, businesses, and other power-consuming structures or entities, overall energy awareness amongst consumers will be drastically improved. This may lead to an overall reduction of strains on precious resources in the global landscape.

Other benefits and advantages of the invention will be apparent to the person of ordinary skill in the art.

Other embodiments and uses of this invention will be apparent to those having ordinary skill in the art upon consideration of the specification and practice of the invention disclosed herein. The specification and examples given should be considered exemplary only, and it is contemplated that the appended claims will cover any other such embodiments or modifications as fall within the true scope of the invention.

What is claimed is:

1. A system for controlling and monitoring a power network, comprising:
a power network interface remote from a power generation source, the power network interface receiving and distributing power from a power network;
a data network interface configured to receive and transmit data over a data network;
a node interface in communication with the data network interface, the node interface identifying, monitoring, and controlling a plurality of individual power-consuming devices through a network of nodes deployed in relation with the individual power-consuming devices, the monitoring further comprising detecting at least a switch state and/or a power consumption level for each individual power-consuming device;
a controller in communication with the power network interface, the data network interface, and the node interface, the controller interpreting the received identifying and monitoring data which comprise switch state and/or power consumption level information of the individual power-consuming devices and controlling the individual power-consuming devices through the network of nodes based on at least the information and any user preference or user command; and
a user interface in communication with the controller, the user interface presenting received data to a user and for receiving commands from the user.

2. The system of claim 1, wherein the controller includes a processor for organizing and controlling the plurality of power-consuming devices according to a hierarchical structure.

3. The system of claim 1, wherein the controller includes a processor for organizing and controlling the plurality of power-consuming devices according to a tagging structure.

4. The system of claim 1, wherein the controller includes a processor for organizing and controlling the plurality of power-consuming devices according to a series of hierarchically nested groups.

5. The system of claim 1, further comprising:
a server located remotely from the controller; and
a wide-area network interface, in communication with the controller and the server, for connecting the controller to the server and for transmitting data from the controller to the server.

6. The system of claim 5, wherein the controller includes a port for receiving information from the server through the wide-area network interface.

7. The system of claim 5, wherein the controller includes a port for receiving information from the server, the information being selected from a group consisting of improved control information, data about other users, pricing feeds, heuristics data, and system updates.

8. The system of claim 1, wherein the controller is selected from a group consisting of: a computer, a mobile device, a server, a remote control device, a handheld device, a display with user input, a thin-client, and a touchscreen device.

9. The system of claim 1, further comprising a wide-area network interface, in communication with the user interface, for receiving commands directed to the user interface from a remote device.

10. The system of claim 1, wherein the controller includes a memory module for storing predetermined user parameters for the control of the plurality of power-consuming devices.

11. The system of claim 10, further including a display and wherein the controller is in communication with the display for presenting the user with alternatives, based on the interpreted identifying and monitoring data, to at least a portion of the predetermined user parameters.

12. The system of claim 10, wherein the controller includes a processor for modifying the predetermined user parameters based on the interpreted identifying and monitoring data.

13. The system according to claim 1, further comprising:
a database, for containing energy-related usage data and display preference data pertaining to one or more users' energy network systems;
a processor, in communication with the database, for analyzing and formatting the energy-related usage data according to the display preference data and transmitting the analyzed and formatted energy-related usage data to a remote device via the data network interface.

14. The system of claim 13, wherein the processor includes a port for receiving commands and display preference data from the remote device that instruct the processor how to analyze, format, and present data to the remote device.

* * * * *